(12) United States Patent
Kondo et al.

(10) Patent No.: US 11,984,380 B2
(45) Date of Patent: May 14, 2024

(54) SEMICONDUCTOR PACKAGE, SEMICONDUCTOR DEVICE, SEMICONDUCTOR PACKAGE-MOUNTED APPARATUS, AND SEMICONDUCTOR DEVICE-MOUNTED APPARATUS

(71) Applicant: Murata Manufacturing Co., Ltd., Kyoto-fu (JP)

(72) Inventors: Masao Kondo, Nagaokakyo (JP); Kenji Sasaki, Nagaokakyo (JP); Shigeki Koya, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 552 days.

(21) Appl. No.: 17/370,953

(22) Filed: Jul. 8, 2021

(65) Prior Publication Data

US 2022/0059427 A1 Feb. 24, 2022

(30) Foreign Application Priority Data

Aug. 21, 2020 (JP) .................................. 2020-140366

(51) Int. Cl.
*H01L 23/367* (2006.01)
*H01L 23/00* (2006.01)
(Continued)

(52) U.S. Cl.
CPC ........ *H01L 23/3675* (2013.01); *H01L 23/055* (2013.01); *H01L 23/3121* (2013.01);
(Continued)

(58) Field of Classification Search
CPC ........... H01L 23/3675; H01L 23/49827; H01L 23/5384; H01L 2224/08165; H01L 2224/16165; H01L 2224/16235; H01L 2224/32165; H01L 2224/32235; H01L 2224/40165; H01L 2224/40235;
(Continued)

(56) References Cited

U.S. PATENT DOCUMENTS 6,933,612 B2 * 8/2005 Kimura ............ H01L 23/49833
257/E23.101

FOREIGN PATENT DOCUMENTS

JP 2004-140286 A 5/2004
JP 2006-073664 A 3/2006
(Continued)

*Primary Examiner* — Amar Movva
(74) *Attorney, Agent, or Firm* — Studebaker & Brackett PC

(57) ABSTRACT

A semiconductor package includes a module substrate having opposite top and bottom surfaces, a semiconductor chip provided with bumps and mounted on the top surface of the module substrate via the bumps, and a metal member having a top portion disposed at a level higher than the semiconductor chip with reference to the top surface of the module substrate and including the semiconductor chip in plan view and a side portion extending from the top portion toward the module substrate. The module substrate includes a first metal film disposed on or in at least one of the bottom surface and an internal layer of the module substrate. The first metal film is electrically connected to the bumps and reaches a side surface of the module substrate. The side portion is thermally coupled to the first metal film at the side surface of the module substrate.

20 Claims, 23 Drawing Sheets

(51) Int. Cl.
*H01L 23/055* (2006.01)
*H01L 23/31* (2006.01)
*H01L 23/42* (2006.01)
*H01L 23/498* (2006.01)
*H01L 25/18* (2023.01)
*H05K 1/11* (2006.01)
*H05K 1/18* (2006.01)

(52) U.S. Cl.
CPC ........ *H01L 23/42* (2013.01); *H01L 23/49822* (2013.01); *H01L 23/49827* (2013.01); *H01L 24/16* (2013.01); *H01L 25/18* (2013.01); *H05K 1/111* (2013.01); *H05K 1/115* (2013.01); *H05K 1/181* (2013.01); *H01L 2224/16227* (2013.01)

(58) Field of Classification Search
CPC . H01L 2224/48165; H01L 2224/48235; H01L 2225/06548
See application file for complete search history.

(56) References Cited

FOREIGN PATENT DOCUMENTS

| JP | 2006-120996 A | 5/2006 |
|---|---|---|
| WO | 2006/043388 A1 | 4/2006 |
| WO | 2018/164160 A1 | 9/2018 |

\* cited by examiner

SEMICONDUCTOR PACKAGE, SEMICONDUCTOR DEVICE, SEMICONDUCTOR PACKAGE-MOUNTED APPARATUS, AND SEMICONDUCTOR DEVICE-MOUNTED APPARATUS

CROSS-REFERENCE TO RELATED APPLICATION

This application claims benefit of priority to Japanese Patent Application No. 2020-140366, filed Aug. 21, 2020, the entire content of which is incorporated herein by reference.

BACKGROUND

Technical Field

The present disclosure relates to a semiconductor package, a semiconductor device, a semiconductor package-mounted apparatus, and a semiconductor device-mounted apparatus.

Background Art

Semiconductor packages are used for power amplifiers of transmitting circuits in mobile terminals and the like. A semiconductor package includes a module substrate, a semiconductor chip, a surface mount device, and the like. The semiconductor chip and the surface mount device are mounted on the module substrate. The semiconductor chip is mounted on the module substrate via a plurality of bumps provided on a device formation surface of transistors and the like. The semiconductor package is mounted on a mother substrate and connected to a power source or other electronic circuits.

The transistors formed in the semiconductor chip generate heat by themselves through amplification operation, and the performance of the transistors deteriorates with an increase in temperature. To reduce the deterioration of performance of the transistors, it is preferable to efficiently radiate heat from the transistors that are heat generating sources to outside the semiconductor chip and the semiconductor package. With the structure in which the semiconductor package is mounted on the mother substrate (base substrate), heat generated by the semiconductor chip is conducted to the mother substrate through the module substrate and is radiated from the mother substrate. For example, Japanese Unexamined Patent Application Publication No. 2006-120996 is an example of related art.

As the output power of an amplifier circuit increases and the operating frequency increases, the amount of heat generated by the transistors increases. For this reason, it is desired to further enhance heat radiation performance from the semiconductor chip. Generally, heat from a semiconductor chip is radiated mostly via a mother substrate, so it is important to enhance heat radiation performance from a mother substrate to the outside, that is, the casing of a device or an environment.

General mobile terminals and the like may not be designed to achieve sufficient heat conduction between a mother substrate and a casing. Since a mother substrate is confined in a narrow space in a casing, it is difficult to ensure a sufficient amount of heat radiation through air convection.

SUMMARY

Accordingly, the present disclosure provides a semiconductor package, a semiconductor device, a semiconductor package-mounted apparatus, and a semiconductor device-mounted apparatus capable of enhancing heat radiation performance from a semiconductor chip.

According to preferred embodiments of the present disclosure, a semiconductor package is provided. The semiconductor package includes a module substrate having a top surface and a bottom surface facing in opposite directions, a semiconductor chip provided with a plurality of bumps and mounted on the top surface of the module substrate via the bumps, and a metal member having a top portion and a side portion. The top portion is disposed at a level higher than the semiconductor chip with reference to the top surface of the module substrate. The top portion includes the semiconductor chip in plan view. The side portion extends from the top portion toward the module substrate. The module substrate includes a first metal film disposed on or in at least one of the bottom surface and an internal layer of the module substrate. The first metal film is electrically connected to the bumps and reaches a side surface of the module substrate. The side portion is thermally coupled to the first metal film at the side surface of the module substrate.

According to other preferred embodiments of the present disclosure, a semiconductor package is provided. The semiconductor package includes a module substrate having a top surface and a bottom surface facing in opposite directions, a semiconductor chip provided with a plurality of bumps and mounted on the top surface of the module substrate via the bumps, and a metal member having a top portion and a side portion. The top portion is disposed at a level higher than the semiconductor chip with reference to the top surface of the module substrate. The top portion includes the semiconductor chip in plan view. The side portion extends from the top portion toward the module substrate. The module substrate includes a metal pad disposed on the top surface in a region that does not overlap the semiconductor chip in plan view, a first metal film disposed on or in at least one of the bottom surface and an internal layer of the module substrate, and a via conductor disposed at a position that overlaps the semiconductor chip in plan view. The via conductor extends from the top surface of the module substrate to the bottom surface. The via conductor is electrically connected to the bumps. The metal pad is electrically connected to the via conductor via the first metal film. The side portion is thermally coupled to the metal pad.

According to further other preferred embodiments of the present disclosure, a semiconductor device is provided. The semiconductor device includes a semiconductor package including a module substrate having a top surface and a bottom surface facing in opposite directions and a semiconductor chip mounted on the top surface of the module substrate, a mother substrate having a top surface and a bottom surface facing in opposite directions and on the top surface of which the semiconductor package is mounted, and a metal member having a top portion and a side portion. The top portion is disposed at a level higher than the semiconductor package with reference to the top surface of the mother substrate. The top portion includes the semiconductor package in plan view. The side portion extends from the top portion toward the mother substrate. The mother substrate includes a metal pad disposed on the top surface in a region that does not overlap the semiconductor package and a second metal film disposed on or in at least one of the bottom surface and an internal layer of the mother substrate. The semiconductor package and the metal pad are electrically connected via the second metal film. The side portion is thermally coupled to the metal pad.

According to yet other preferred embodiments of the present disclosure, a semiconductor package-mounted apparatus is provided. The semiconductor package-mounted apparatus includes the above-described semiconductor package, a casing accommodating the semiconductor package, and a thermal coupling member thermally coupling the top portion to the casing.

According to further other preferred embodiments of the present disclosure, a semiconductor device-mounted apparatus is provided. The semiconductor device-mounted apparatus includes the above-described semiconductor device, a casing accommodating the semiconductor device, and a thermal coupling member thermally coupling the top portion to the casing.

A heat conduction path from the semiconductor chip to the top portion via the first metal film or the second metal film and the side portion of the metal member is formed. The top portion can be used as part of the heat conduction path from the semiconductor chip to a heat sink. As a result, heat radiation performance from the semiconductor chip is enhanced.

Other features, elements, characteristics and advantages of the present disclosure will become more apparent from the following detailed description of preferred embodiments of the present disclosure with reference to the attached drawings.

DETAILED DESCRIPTION

First Embodiment

A semiconductor package according to a first embodiment and a semiconductor package-mounted apparatus will be described with reference to FIG. 1 to FIG. 3.

Figure 1:
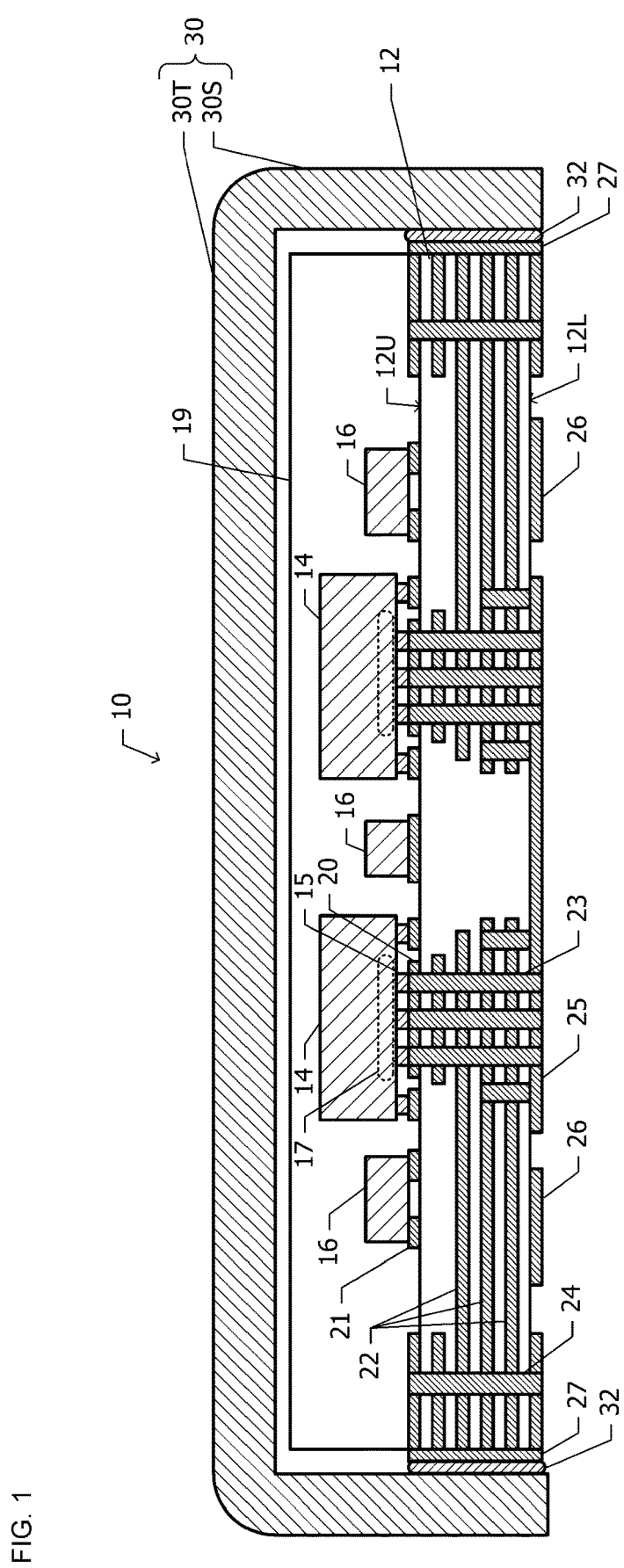
FIG. 1 is a cross-sectional view of a semiconductor package according to a first embodiment.

FIG. 1 is a cross-sectional view of the semiconductor package 10 according to the first embodiment. The semiconductor package 10 according to the first embodiment includes a module substrate 12, a plurality of semiconductor chips 14, and a metal member 30. The module substrate 12 has a top surface 12U and a bottom surface 12L facing in opposite directions. A plurality of bumps 15 is provided on each of device formation surfaces of the plurality of semiconductor chips 14. Each of the plurality of semiconductor chips 14 is mounted on the top surface 12U of the module substrate 12 via the plurality of bumps 15 so as to face downward. A plurality of transistors is formed at the device formation surface of each semiconductor chip 14. The plurality of transistors is a heat generating source 17.

Alternatively, a single semiconductor chip 14 may be mounted on the module substrate 12. A plurality of surface mount devices 16, such as inductors and capacitors, is further mounted on the top surface 12U of the module substrate 12.

A plurality of metal pads 20, 21 is provided on the top surface 12U of the module substrate 12. The plurality of bumps 15 of each semiconductor chip 14 is connected to the plurality of metal pads 20 by solder or the like. The plurality of surface mount devices 16 is connected to the other plurality of metal pads 21 by solder or the like.

A plurality of first metal films 22 serving as ground planes is disposed in the internal layer of the module substrate 12. For example, a multilayer printed circuit board is used as the module substrate 12. A plurality of metal wires, a plurality of metal films, and the like other than the first metal films 22 are also disposed in the internal layer of the module substrate 12.

The plurality of first metal films 22 is connected to some of the metal pads 20 via a plurality of via conductors 23 disposed in the module substrate 12 in regions that overlap the semiconductor chips 14 in plan view. In other words, the first metal films 22 are electrically connected to some of the bumps 15 of the semiconductor chips 14. The bumps 15 to which the first metal films 22 are electrically connected are, for example, bumps for grounds of the semiconductor chips 14. The first metal films 22 extend from positions that overlap the semiconductor chips 14 in plan view, pass through regions that overlap the surface mount devices 16 in plan view, and reach the side surfaces of the module substrate 12. The end surfaces of the first metal films 22 are exposed at the side surfaces of the module substrate 12.

Metal pads 25, 26 are provided on the bottom surface of the module substrate 12. The via conductors 23 connecting the first metal films 22 and the bumps 15 of the semiconductor chips 14 extend from the top surface 12U of the module substrate 12 to the bottom surface 12L and are connected to the metal pads 25 provided on the bottom surface 12L. The plurality of first metal films 22 is connected to one another by a plurality of via conductors 24 near the side surfaces of the module substrate 12. The plurality of via conductors 24 extends from the top surface 12U of the module substrate 12 to the bottom surface 12L and each are connected to metal films respectively disposed on the top surface 12U and the bottom surface 12L.

Each of the plurality of via conductors 23, 24 may be made up of, for example, a metal member that buries through-hole vias extending through the module substrate 12 or may be made up of wiring layers in the module substrate 12 and a metal member that buries inner vias provided in electrically insulating films between the wiring layers. For example, copper may be used for the first metal films 22, the metal pads 20, 21 on the top surface 12U, the metal pads 25, 26 on the bottom surface 12L, the via conductors 23, 24, and the other metal wires and metal films.

The first metal film 22 may be disposed on the bottom surface 12L of the module substrate 12. The plurality of first metal films 22 may be disposed in the internal layer of the module substrate 12 and on the bottom surface 12L of the module substrate 12. In other words, the first metal films 22 just need to be disposed on or in at least one of the internal layer and the bottom surface 12L of the module substrate 12.

The plurality of semiconductor chips 14 and the plurality of surface mount devices 16 are sealed with a sealing resin 19. Side metal films 27 are disposed on the side surfaces of the module substrate 12. The side metal films 27 are formed by, for example, plating copper. The side metal films 27 are connected to the first metal films 22 at the side surfaces of the module substrate 12.

The cap-shaped metal member 30 covers the module substrate 12 from the sealing resin 19 side. The metal member 30 has a top portion 30T and a side portion 30S. The top portion 30T is disposed at a level higher than the semiconductor chips 14 with reference to the top surface 12U of the module substrate 12. The side portion 30S extends from the top portion 30T toward the module substrate 12. In plan view, the top portion 30T includes the plurality of semiconductor chips 14.

The side portion 30S of the metal member 30 is fixed to each of the side metal films 27 by a thermally conductive bonding material 32. For example, solder, a thermally conductive paste, or the like may be used as the thermally conductive bonding material 32. Thus, the side portion 30S of the metal member 30 is thermally coupled to the first metal films 22 via the thermally conductive bonding materials 32 and the side metal films 27 at the side surfaces of the module substrate 12. Here, the phrase "thermal coupling" means that two members are coupled via a material having a thermal conductivity sufficiently higher than an electrically insulating material or directly coupled without intervening an electrically insulating layer of the module substrate 12 or an electrically insulating material such as the sealing resin. When, for example, two members are coupled via only a material having a thermal conductivity of higher than or equal to about 10 W/m·K, the two members may be regarded as being thermally coupled. When two electrically conductive members are electrically connected, the two electrically conductive members are regarded as being thermally coupled.

Figure 2:
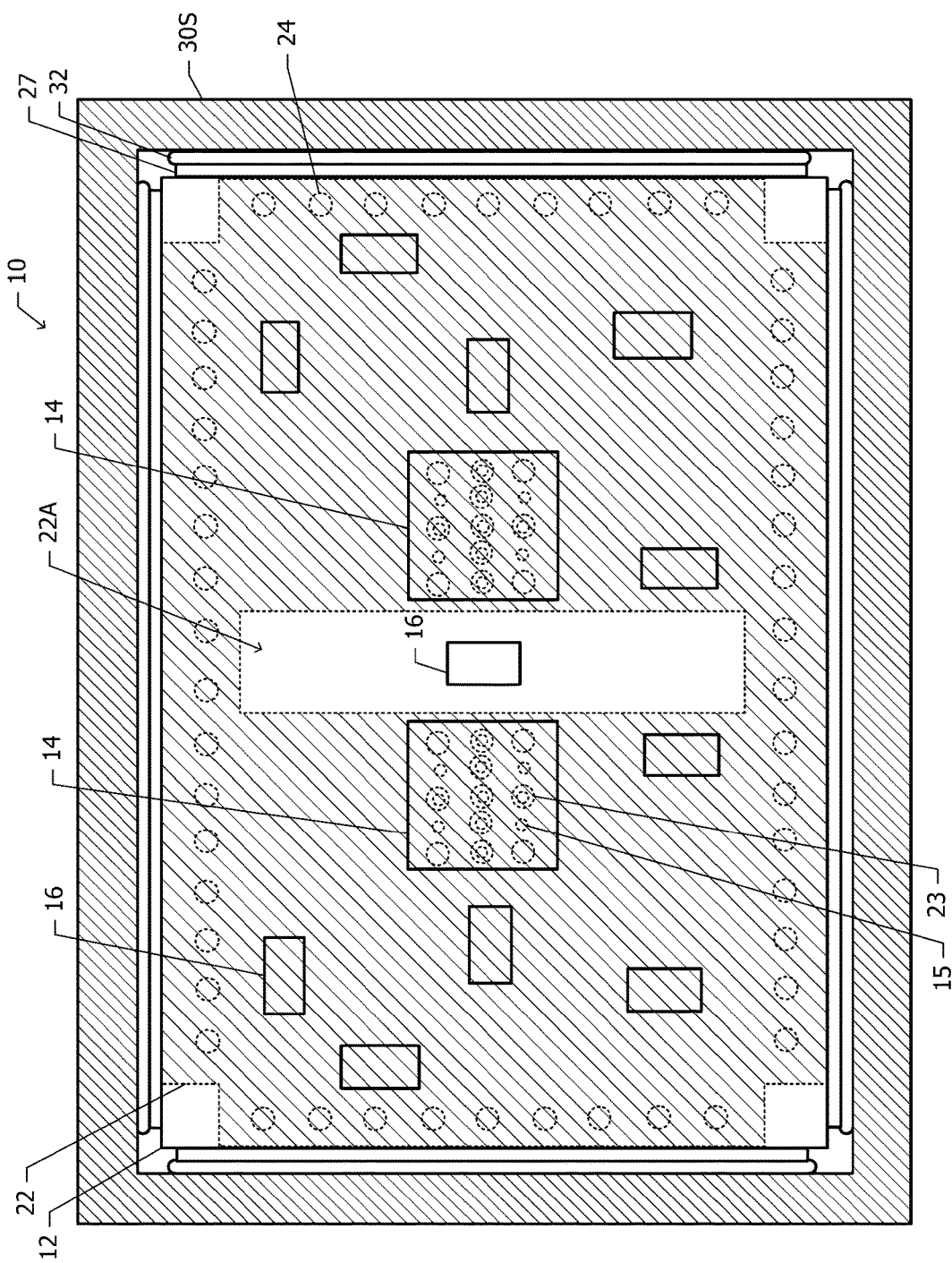
FIG. 2 is a view showing a positional relation in plan view among components of the semiconductor package according to the first embodiment.

FIG. 2 is a view showing a positional relation in plan view among components of the semiconductor package 10 according to the first embodiment. In FIG. 2, signal wires are not shown, and the side portion 30S of the metal member 30 and the first metal film 22 are hatched. FIG. 2 shows one of the three first metal films 22 shown in FIG. 1. The first metal film 22 is disposed in the internal layer of the substantially rectangular module substrate 12. The first metal film 22 has an outer shape such that the first metal film 22 is cut away in a substantially square shape at positions corresponding to four vertexes of the module substrate 12, and edges other than the cut-away portions are exposed to the four side surfaces of the module substrate 12. A substantially rectangular opening 22A is provided at the center of the first metal film 22. For example, signal wires are disposed inside the opening 22A.

The two semiconductor chips 14 are disposed across the opening 22A in plan view. The plurality of surface mount devices 16 is mounted on the module substrate 12. For example, one of the surface mount devices 16 is disposed in the opening 22A, and the other surface mount devices 16 are disposed at positions that overlap the first metal film 22. Each semiconductor chip 14 has the plurality of bumps 15. The plurality of via conductors 23 is disposed inside the semiconductor chips 14 in plan view, and the plurality of via conductors 24 is disposed slightly inside the side surfaces of the module substrate 12. Some of the bumps 15 are respectively disposed at positions that overlap the via conductors 23 in plan view.

The side metal films 27 are respectively disposed at the four side surfaces of the module substrate 12. The side metal films 27 are connected to the first metal films 22. The side portion 30S of the metal member 30 surrounds the module substrate 12 from four sides in plan view. The side portion 30S is connected to the side metal film 27 by the thermally conductive bonding material 32 at each of the four side surfaces of the module substrate 12.

Figure 3:
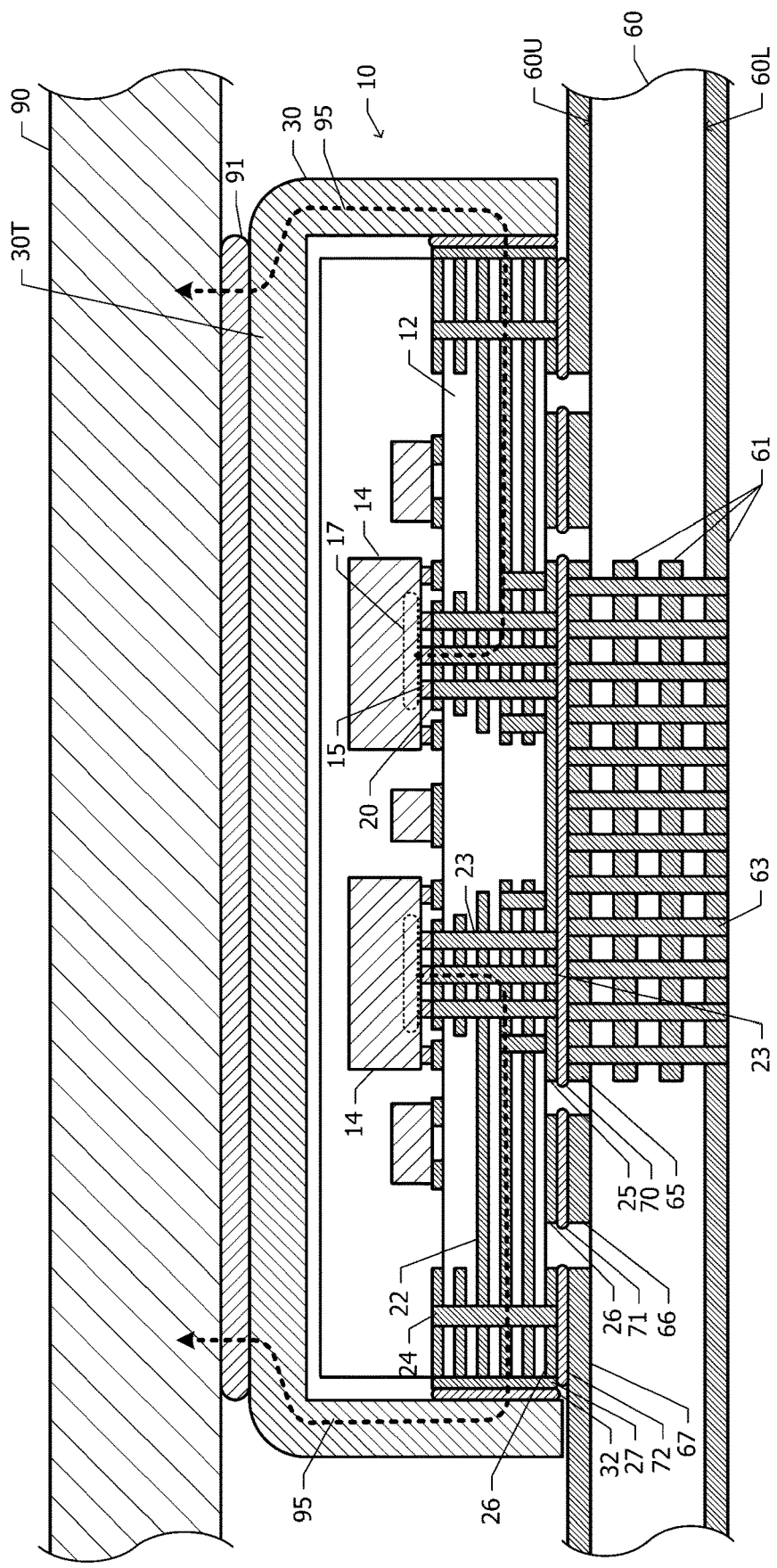
FIG. 3 is a partially cross-sectional view of a semiconductor package-mounted apparatus in which the semiconductor package according to the first embodiment is mounted.

FIG. 3 is a partially cross-sectional view of a semiconductor package-mounted apparatus in which the semiconductor package 10 according to the first embodiment is mounted. The semiconductor package-mounted apparatus is, for example, a mobile terminal. A mother substrate 60 has a top surface 60U and a bottom surface 60L facing in opposite directions. A plurality of metal pads 65, 66, 67 is provided on the top surface 60U of the mother substrate 60. The metal pad 65 overlaps the semiconductor chips 14 in plan view. The metal pad 67 overlap the side surfaces of the module substrate 12 in plan view.

The plurality of metal pads 25 provided on the module substrate 12 is connected to the metal pad 65 on the top surface 60U of the mother substrate 60 by solder 70. Each of the metal pads 26 of the semiconductor package 10 is connected by solder 71 to the metal pad 66 provided on the mother substrate 60 or connected by solder 72 to the metal pad 67 provided on the mother substrate 60. By connecting the metal pads 25, 26 of the semiconductor package 10 to the metal pads 65, 66, 67 of the mother substrate 60, the semiconductor package 10 is mounted on the mother substrate 60.

A plurality of second metal films 61 is disposed in the internal layer and on the bottom surface 60L of the mother substrate 60. The plurality of second metal films 61 is connected to one another and the metal pad 65 on the top surface 60U by a plurality of via conductors 63 extending from the top surface 60U to the bottom surface 60L.

The semiconductor package 10 and the mother substrate 60 are accommodated in a casing 90. Part of the casing 90 is made of, for example, a metal, such as aluminum. The top portion 30T of the metal member 30 is attached to the inner surface of the casing 90, for example, the inner surface of a metal portion, by a thermal coupling member 91. The metal member 30 is thermally coupled to the casing 90 via the thermal coupling member 91. For example, a thermally conductive paste, a thermally conductive sheet, or the like may be used as the thermal coupling member 91.

Next, advantageous effects of the first embodiment will be described in comparison with a semiconductor package-mounted apparatus according to a comparative example. In the semiconductor package-mounted apparatus according to the comparative example, the side metal films 27, the thermally conductive bonding materials 32 (FIG. 1 and FIG. 2), the thermal coupling member 91 (FIG. 3), and the like are not disposed. For this reason, no heat conduction paths 95 (FIG. 3) are formed in the comparative example. Heat generated by the heat generating sources 17 is conducted to the second metal films 61 disposed in the internal layer and on the bottom surface 60L of the mother substrate 60 via the bumps 15, the metal pads 20 on the top surface 12U, the via conductors 23, the metal pads 25 on the bottom surface 12L, the solder 70, the metal pad 65 of the mother substrate 60, and the via conductors 63. A sufficient heat conduction path from the mother substrate 60 to the casing 90 or members outside the apparatus is not always ensured.

In contrast, in the semiconductor package 10 according to the first embodiment, heat conduction paths 95 from the heat generating sources 17 of the semiconductor chips 14 to the casing 90 via the bumps 15, the metal pads 20, the via conductors 23, the first metal films 22, the side metal films 27, the thermally conductive bonding materials 32, the metal member 30, and the thermal coupling member 91 are formed. Heat generated by the heat generating sources 17 is conducted to the casing 90 through the heat conduction paths 95, and the casing 90 functions as a heat sink. In this way, in the first embodiment, the heat conduction paths 95 having a low thermal resistance are ensured from the heat generating sources 17 to the heat sink. For this reason, an excessive increase in the temperature of the semiconductor chips 14 is suppressed, with the result that performance degradation due to the self-heating of the semiconductor chips 14 is reduced.

In addition, in the first embodiment, the metal member 30 is attached to the side surfaces of the module substrate 12, and no region for attaching the metal member 30 needs to be ensured on the top surface 12U of the module substrate 12. Therefore, the size of the module substrate 12 can be reduced.

Figure 4:
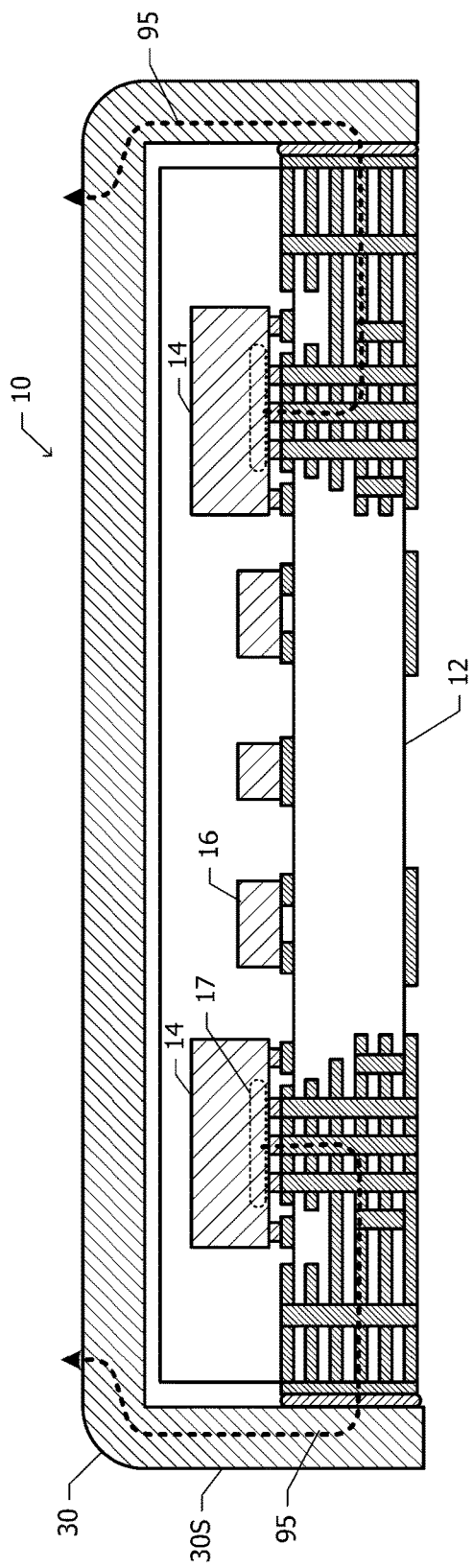
FIG. 4 is a cross-sectional view of a semiconductor package according to a modification of the first embodiment.

Next, a modification of the first embodiment will be described with reference to FIG. 4. FIG. 4 is a cross-sectional view of the semiconductor package 10 according to the modification of the first embodiment. In the semiconductor package 10 (FIG. 1) according to the first embodiment, the surface mount device 16 is disposed on the line connecting the each semiconductor chip 14 to one of the side surfaces of the module substrate 12 at the shortest distance. In contrast, in the present modification, the surface mount device 16 is not disposed on the line connecting each semiconductor chip 14 to one of the side surfaces of the module substrate 12 at the shortest distance. The shortest distance from each semiconductor chip 14 to one of the side surfaces of the module substrate 12 is shorter than that in the case of the first embodiment (FIG. 1 and FIG. 3). Therefore, the heat conduction path 95 from each semiconductor chip 14 to the side portion 30S of the metal member 30 is shorter than that in the case of the first embodiment (FIG. 1 and FIG. 3).

In the present modification, the heat conduction paths 95 become shorter than those of the first embodiment, so the thermal resistance of each heat conduction path 95 from the semiconductor chip 14 to the metal member 30 reduces. As a result, heat generated by the heat generating sources 17 of the semiconductor chips 14 is further efficiently conducted to the casing 90 (FIG. 3) serving as a heat sink. Thus, heat radiation performance from the semiconductor chips 14 is enhanced.

Next, the semiconductor package 10 according to another modification of the first embodiment will be described with reference to FIG. 5.

Figure 5:
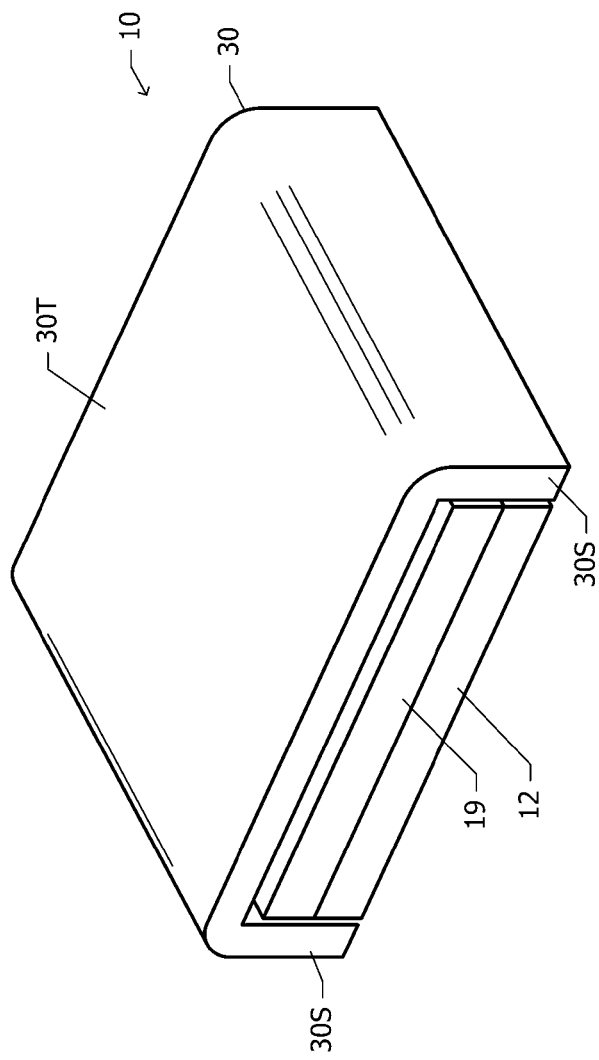
FIG. 5 is a schematic perspective view of a semiconductor package according to another modification of the first embodiment.

FIG. 5 is a schematic perspective view of the semiconductor package 10 according to another modification of the first embodiment. In the first embodiment, the side portion 30S (FIG. 2) of the metal member 30 surrounds the module substrate 12 from four sides. In contrast, in the present modification, the side portion 30S of the metal member 30 is provided at positions facing two side surfaces of the module substrate 12, facing in opposite directions, and the side portion 30S is not provided at positions facing the other two side surfaces. In other words, the metal member 30 is made up of the substantially rectangular or square top portion 30T, and the two side portions 30S bending at two opposite edges and extending toward the module substrate 12.

As in the case of the present modification, the first metal films 22 (FIG. 1) and the side portion 30S (FIG. 1) of the metal member 30 may be thermally coupled at two side surfaces out of the four side surfaces of the module substrate 12. Alternatively, the first metal films 22 (FIG. 1) and the side portion 30S (FIG. 1) of the metal member 30 may be thermally coupled at three side surfaces out of the four side surfaces of the module substrate 12. The first metal films 22 (FIG. 1) and the side portion 30S (FIG. 1) of the metal member 30 do not necessarily need to be thermally coupled over substantially all the region from one end to the other end of each of the side surfaces of the module substrate 12. The first metal films 22 (FIG. 1) and the side portion 30S (FIG. 1) of the metal member 30 may be thermally coupled over part of the peripheral region of each of the side surfaces of the module substrate 12.

Second Embodiment

Next, a semiconductor package according to a second embodiment will be described with reference to FIG. 6. Hereinafter, the description of components common to the semiconductor package 10 (FIG. 1, FIG. 2, and FIG. 3) according to the first embodiment is omitted.

Figure 6:
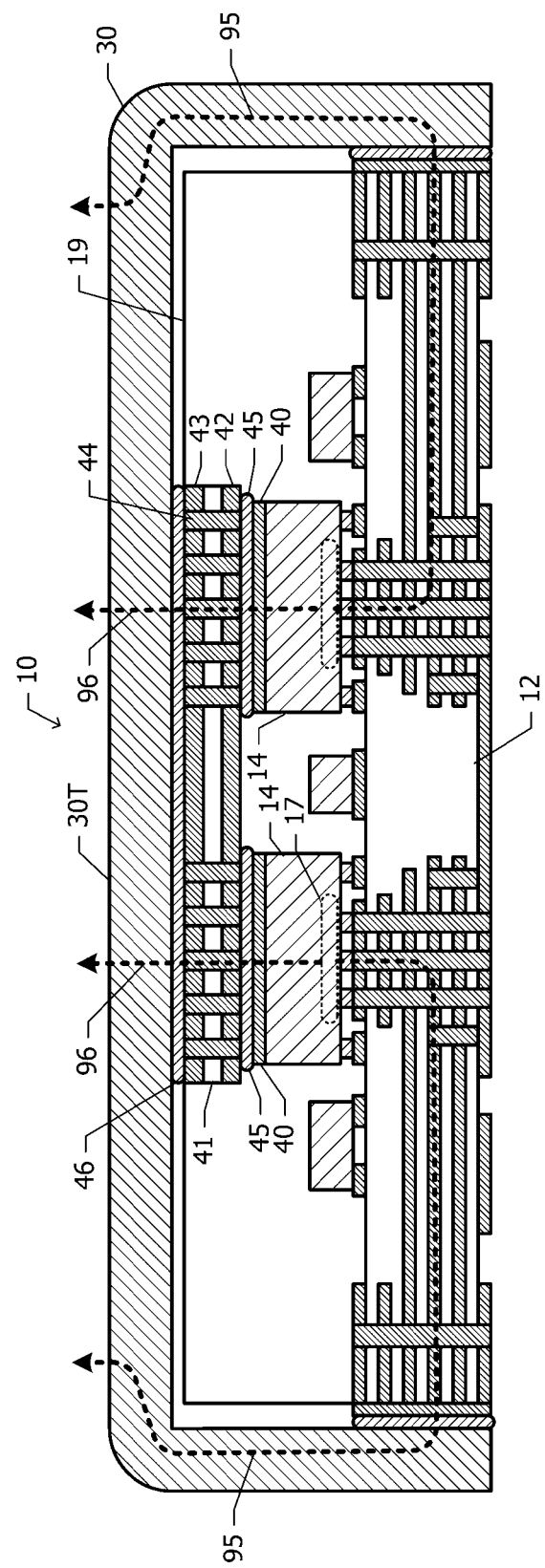
FIG. 6 is a cross-sectional view of a semiconductor package according to a second embodiment.

FIG. 6 is a cross-sectional view of the semiconductor package 10 according to the second embodiment. In the first embodiment, a surface across from the device formation surface of each semiconductor chip 14 (FIG. 1) is covered with the sealing resin 19. In contrast, in the second embodiment, a back surface metal film 40 is disposed on the surface across from the device formation surface (surface facing the module substrate 12) of each semiconductor chip 14. For example, copper may be used for the back surface metal films 40.

A single printed circuit board 41 is disposed on the back surface metal films 40 of the plurality of semiconductor chips 14. Metal films 42, 43 are respectively provided on the surface facing the semiconductor chips 14 and the opposite surface of the printed circuit board 41. A plurality of via conductors 44 extending from one of the surfaces to the other one of the surfaces is disposed in the printed circuit board 41. The back surface metal films 40 are connected to the metal film 42 of the printed circuit board 41 by solder 45. The opposite-side metal film 43 of the printed circuit board 41 is not covered with the sealing resin 19 and is exposed from the sealing resin 19.

The metal film 43 of the printed circuit board 41 is connected to the inner surface of the top portion 30T of the metal member 30 by solder 46. In this way, the printed circuit board 41 is disposed between the back surface metal films 40 and the top portion 30T, and includes metal portions from one surface to the other surface, that is, the metal films 42, 43 and the plurality of via conductors 44. The top portion 30T is thermally coupled to the back surface metal films 40 via the metal portions of the printed circuit board 41. Heat conduction paths 96 from the heat generating sources 17 of the semiconductor chips 14 to the top portion 30T through the semiconductor substrates of the semiconductor chips 14, the back surface metal films 40, the solder 45, the metal portions of the printed circuit board 41, and the solder 46 are formed. The thermal conductivity of the semiconductor substrate of each semiconductor chip 14 is low as compared to a metal, such as copper and aluminum, and is sufficiently high as compared to an electrically insulating resin material such as the surrounding sealing resin 19. Therefore, the semiconductor substrate of each semiconductor chip 14 functions as part of the heat conduction path 96.

Next, advantageous effects of the second embodiment will be described. In the second embodiment, the heat conduction paths 95 passing through the inside of the module substrate 12 and the heat conduction paths 96 passing through the semiconductor substrates of the semiconductor chips 14 and the printed circuit board 41 are formed as heat conduction paths from the heat generating sources 17 of the semiconductor chips 14 to the casing 90 (FIG. 3) through the metal member 30. Therefore, heat radiation performance from the heat generating sources 17 is further enhanced as compared to the first embodiment.

Figure 7:
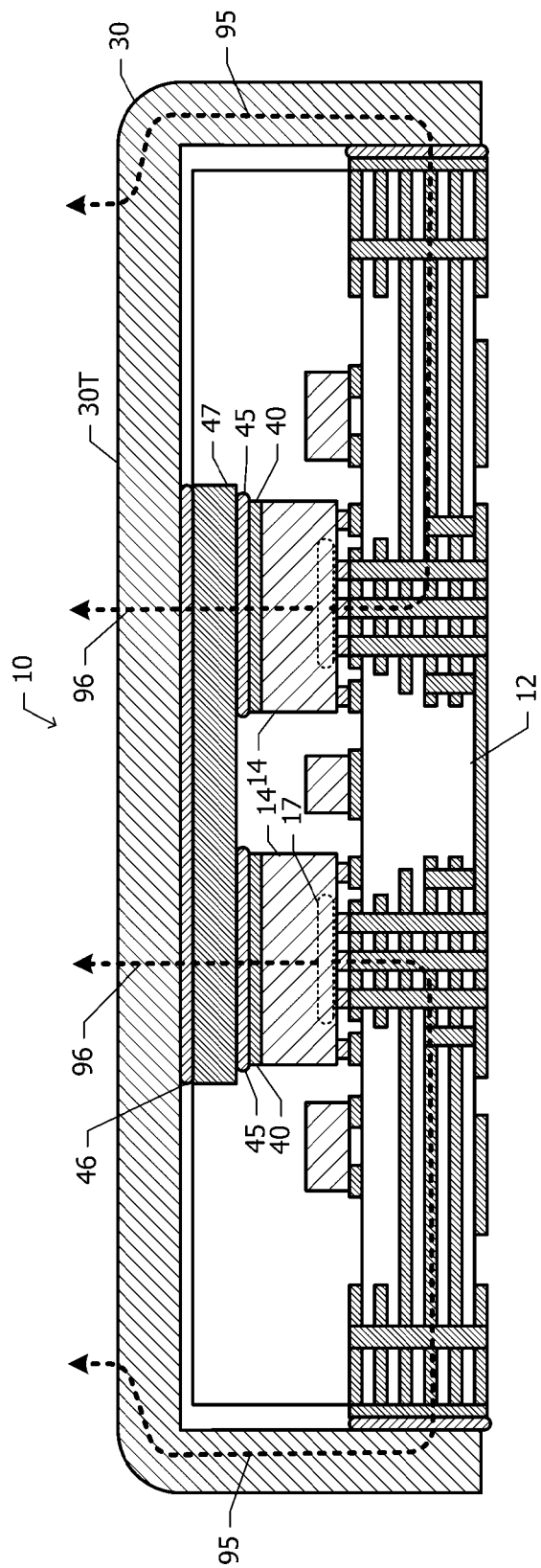
FIG. 7 is a cross-sectional view of a semiconductor package according to a modification of the second embodiment.

Next, a semiconductor package according to a modification of the second embodiment will be described with reference to FIG. 7. FIG. 7 is a cross-sectional view of the semiconductor package 10 according to the modification of the second embodiment. In the present modification, instead of the printed circuit board 41 (FIG. 6) used in the semiconductor package 10 according to the second embodiment, a heat conduction plate 47 is disposed between the semiconductor chips 14 and the top portion 30T of the metal member 30. For example, a metal plate, such as copper, is used as the heat conduction plate 47. The top portion 30T is thermally coupled to the back surface metal films 40 via the heat conduction plate 47. In the present modification, the heat conduction plate 47 makes up part of each heat conduction path 96, so heat radiation performance from the heat generating sources 17 is enhanced as in the case of the second embodiment.

Next, another modification of the second embodiment will be described. The printed circuit board 41 is disposed between the top portion 30T and the semiconductor chips 14 in the second embodiment (FIG. 6). The heat conduction plate 47 is disposed between the top portion 30T and the semiconductor chips 14 in the modification (FIG. 7) of the second embodiment. As another modification, the back surface metal films 40 and the top portion 30T may be directly connected by solder without disposing the printed circuit board 41 or the heat conduction plate 47. The back surface metal films 40 are exposed from the sealing resin 19 in a state before the back surface metal films 40 are connected to the top portion 30T. In the present modification, the back surface metal films 40 are thermally coupled to the top portion 30T via solder. In the present modification as well, heat radiation performance from the heat generating sources 17 is enhanced.

Third Embodiment

Next, a semiconductor package according to a third embodiment will be described with reference to FIG. 8 and FIG. 9. Hereinafter, the description of components common to the semiconductor package 10 (FIG. 1, FIG. 2, and FIG. 3) according to the first embodiment is omitted.

Figure 8:
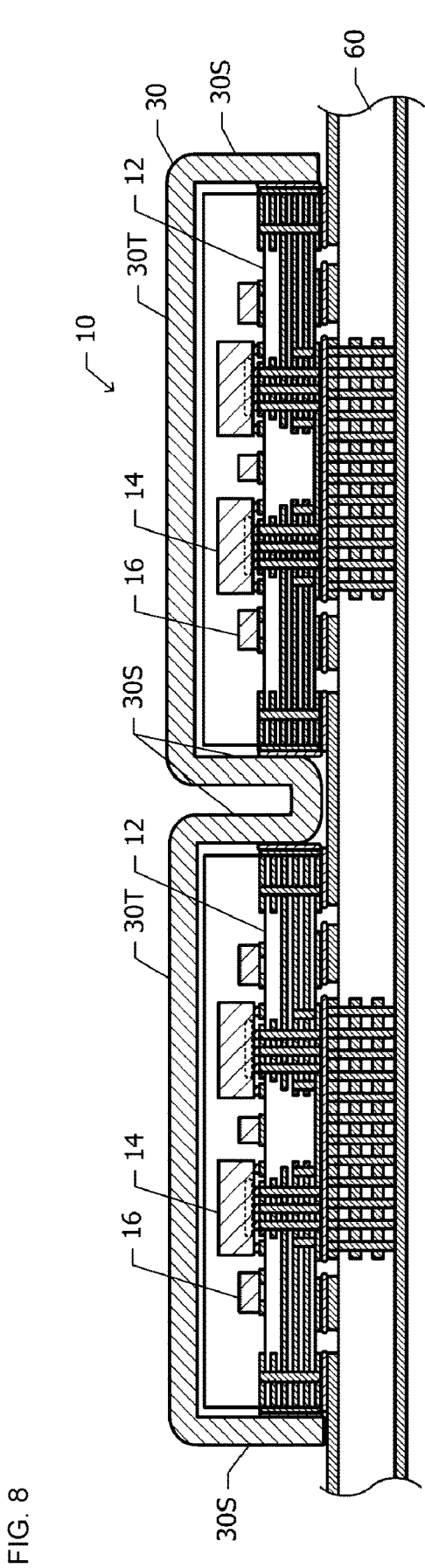
FIG. 8 is a cross-sectional view of a semiconductor package according to a third embodiment.
Figure 9:
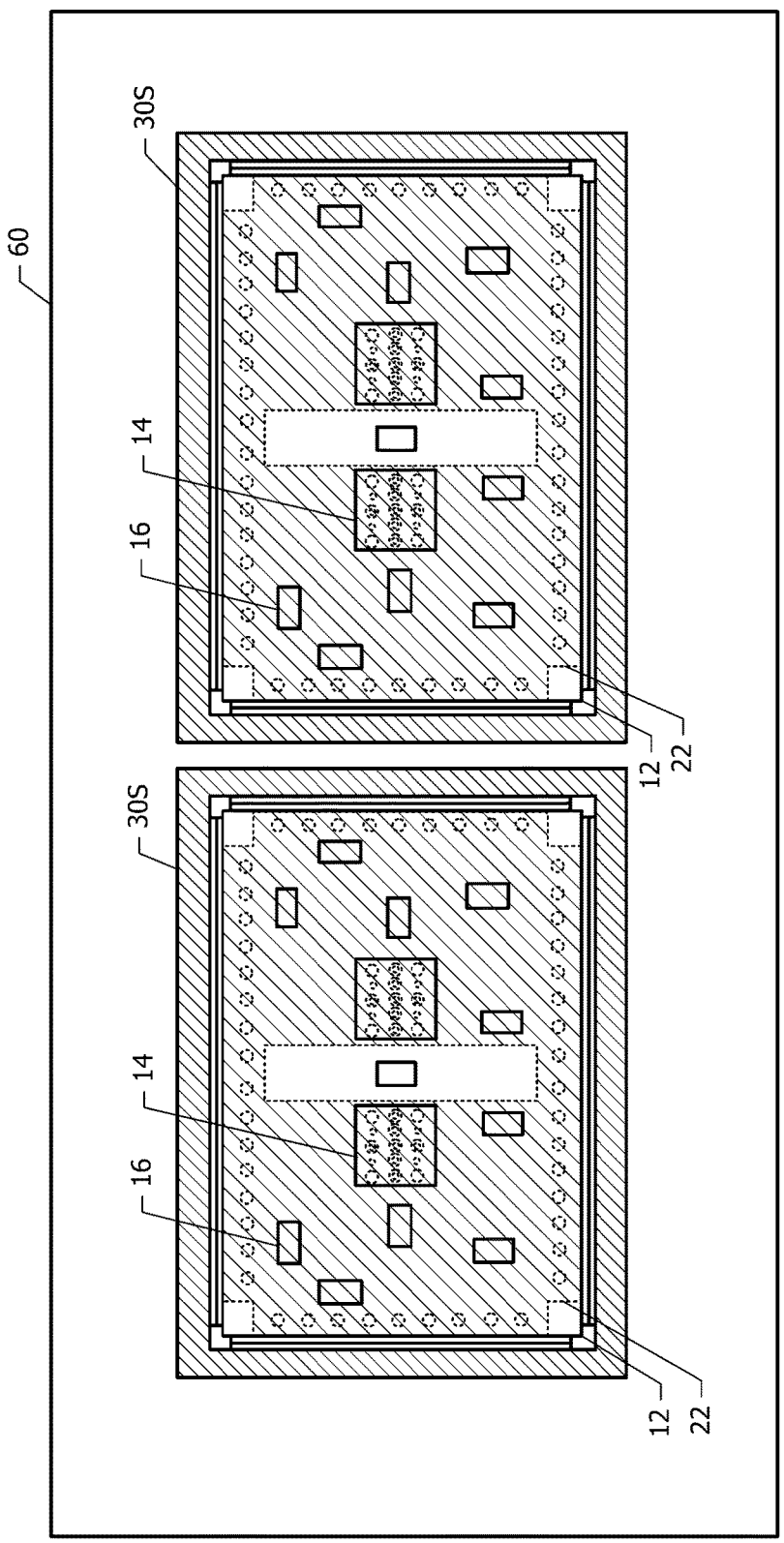
FIG. 9 is a view showing a positional relation in plan view among components of the semiconductor package according to the third embodiment.

FIG. 8 is a cross-sectional view of the semiconductor package 10 according to the third embodiment. FIG. 9 is a view showing a positional relation in plan view among components of the semiconductor package 10 according to the third embodiment. In the first embodiment (FIG. 1), one metal member 30 is attached to one module substrate 12. In contrast, in the third embodiment, one metal member 30 is attached to two module substrates 12. In FIG. 9, the side portions 30S of the metal member 30 and the first metal films 22 are hatched.

In plan view, the two module substrates 12 are disposed on a common imaginary plane such that one of the side surfaces of each module substrate 12 faces each other. The plurality of semiconductor chips 14 and the plurality of surface mount devices 16 are mounted on each of the two module substrates 12. A module configuration including the module substrate 12, the semiconductor chips 14, and the surface mount devices 16 is the same as the module configuration of the module substrate 12, the semiconductor chips 14, and the surface mount devices 16 of the semiconductor package 10 according to the first embodiment.

The metal member 30 has the two top portions 30T in association with the two module substrates 12. The side portions 30S are respectively continuous with the two top portions 30T. The side portion 30S continuous with each of the two top portions 30T surrounds an associated one of the module substrates 12 from four sides in plan view. Parts of the two side portions 30S located between the two module substrates 12 are continuous with each other at their lower ends. In other words, the metal member 30 has two recessed portions, and the module substrates 12 are respectively accommodated in the two recessed portions. The metal member 30 is formed by, for example, press working of a metal sheet. The semiconductor package 10 including the two module substrates 12 is mounted on the mother substrate 60.

Next, advantageous effects of the third embodiment will be described. In the third embodiment as well, by thermally coupling the top portions 30T of the metal member 30 to the casing as in the case of the first embodiment, heat conduction paths from the semiconductor chips 14 to the casing through the metal member 30 are ensured. Thus, performance degradation due to an excessive increase in the temperature of the semiconductor chips 14 is suppressed. In addition, the two module substrates 12 are accommodated in the one metal member 30, so a footprint on the mother substrate 60 is reduced as compared to the configuration in which the two module substrates 12 are separately accommodated in metal members.

Fourth Embodiment

Next, a semiconductor package according to a fourth embodiment will be described with reference to FIG. 10 and FIG. 11. Hereinafter, the description of components common to the semiconductor package 10 (FIG. 1, FIG. 2, and FIG. 3) according to the first embodiment is omitted.

Figure 10:
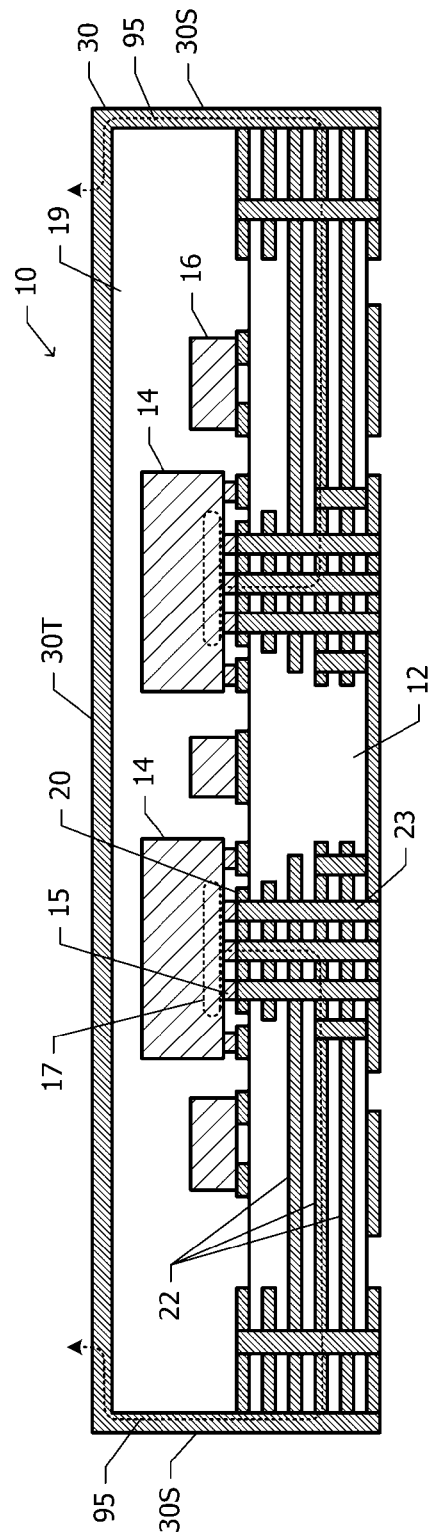
FIG. 10 is a cross-sectional view of a semiconductor package according to a fourth embodiment.

FIG. 10 is a cross-sectional view of the semiconductor package 10 according to the fourth embodiment. In the first embodiment, the metal cap is used as the metal member 30 of the semiconductor package 10 (FIG. 1). In contrast, in the fourth embodiment, a metal coating film that covers the surface of the sealing resin 19 and the side surfaces of the module substrate 12 is used as the metal member 30. The coating film may be formed by vacuum deposition, plating, or the like. The coating film may be formed by applying plating to a vacuum-deposited metal film.

The top portion 30T of the metal member 30 covers the top surface of the sealing resin 19. The side portion 30S covers the side surfaces of the sealing resin 19 and the side surfaces of the module substrate 12. The side portion 30S is directly connected to the end surfaces of the first metal films 22 at the side surfaces of the module substrate 12.

Figure 11:
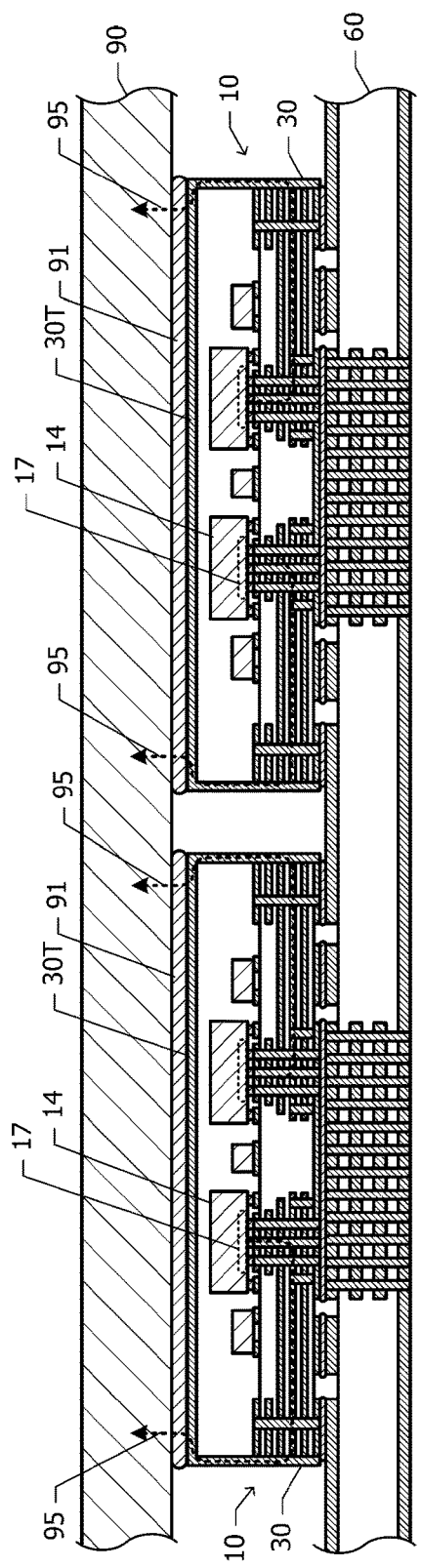
FIG. 11 is a cross-sectional view of a state where the semiconductor package according to the fourth embodiment is mounted on a mother substrate and accommodated in a casing.

FIG. 11 is a cross-sectional view of a state where the semiconductor packages 10 according to the fourth embodiment are mounted on the mother substrate 60 and accommodated in the casing 90. Two semiconductor packages 10 are mounted on one mother substrate 60. The top portions 30T of the two semiconductor packages 10 each are thermally coupled to the casing 90 via the thermal coupling member 91, such as solder. The heat conduction paths 95 from the heat generating sources 17 of the semiconductor chips 14 to the casing 90 through the plurality of bumps 15, the metal pads 20 disposed on the top surfaces 12U of the module substrates 12, the plurality of via conductors 23, the plurality of first metal films 22, the metal members 30, and the thermal coupling members 91 are formed.

Next, advantageous effects of the fourth embodiment will be described. The heat conduction paths 95 are ensured for each of the semiconductor packages 10, so, as in the case of the first embodiment, performance degradation due to an excessive increase in the temperature of the semiconductor chips 14 is suppressed. In the first embodiment, a mechanical assembling process for accommodating the module substrate 12 in the recessed portion of the metal member 30 made up of the metal cap is needed. This assembling process needs high alignment accuracy. In contrast, in the fourth embodiment, the metal member 30 is formed by vacuum deposition, plating, or the like, so no mechanical assembling process that needs high alignment accuracy is needed.

Fifth Embodiment

Next, a semiconductor package according to a fifth embodiment will be described with reference to FIG. 12. Hereinafter, the description of components common to the semiconductor packages 10 (FIG. 10 and FIG. 11) according to the fourth embodiment is omitted.

Figure 12:
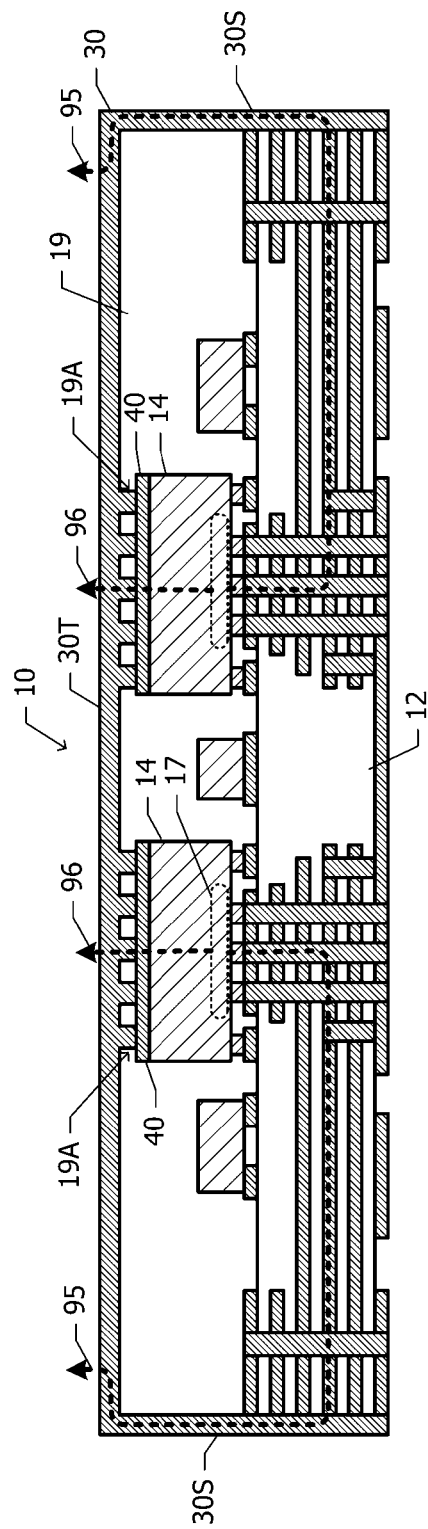
FIG. 12 is a cross-sectional view of a semiconductor package according to a fifth embodiment.

FIG. 12 is a cross-sectional view of the semiconductor package 10 according to the fifth embodiment. In the fifth embodiment, the back surface metal film 40 is disposed on the surface across from the device formation surface (surface facing the module substrate 12) of each semiconductor chip 14. The sealing resin 19 sealing the semiconductor chips 14 has a plurality of openings 19A extending from the top surface of the sealing resin 19 to the back surface metal films 40. The metal member 30 is connected to the back surface metal films 40 through the plurality of openings 19A of the sealing resin 19. Thus, the metal member 30 is thermally coupled to the back surface metal films 40.

Next, advantageous effects of the fifth embodiment will be described. In the fifth embodiment, in addition to the heat conduction paths 95 passing through the module substrate 12, the heat conduction paths 96 from the heat generating sources 17 to the top portion 30T of the metal member 30 through the semiconductor substrates of the semiconductor chips 14 and the back surface metal films 40 are formed. Therefore, heat radiation performance from the heat generating sources 17 is further enhanced as compared to the fourth embodiment (FIG. 10).

Sixth Embodiment

Next, a semiconductor package according to a sixth embodiment will be described with reference to FIG. 13. Hereinafter, the description of components common to the semiconductor package 10 (FIG. 1, FIG. 2, and FIG. 3) according to the first embodiment is omitted.

Figure 13:
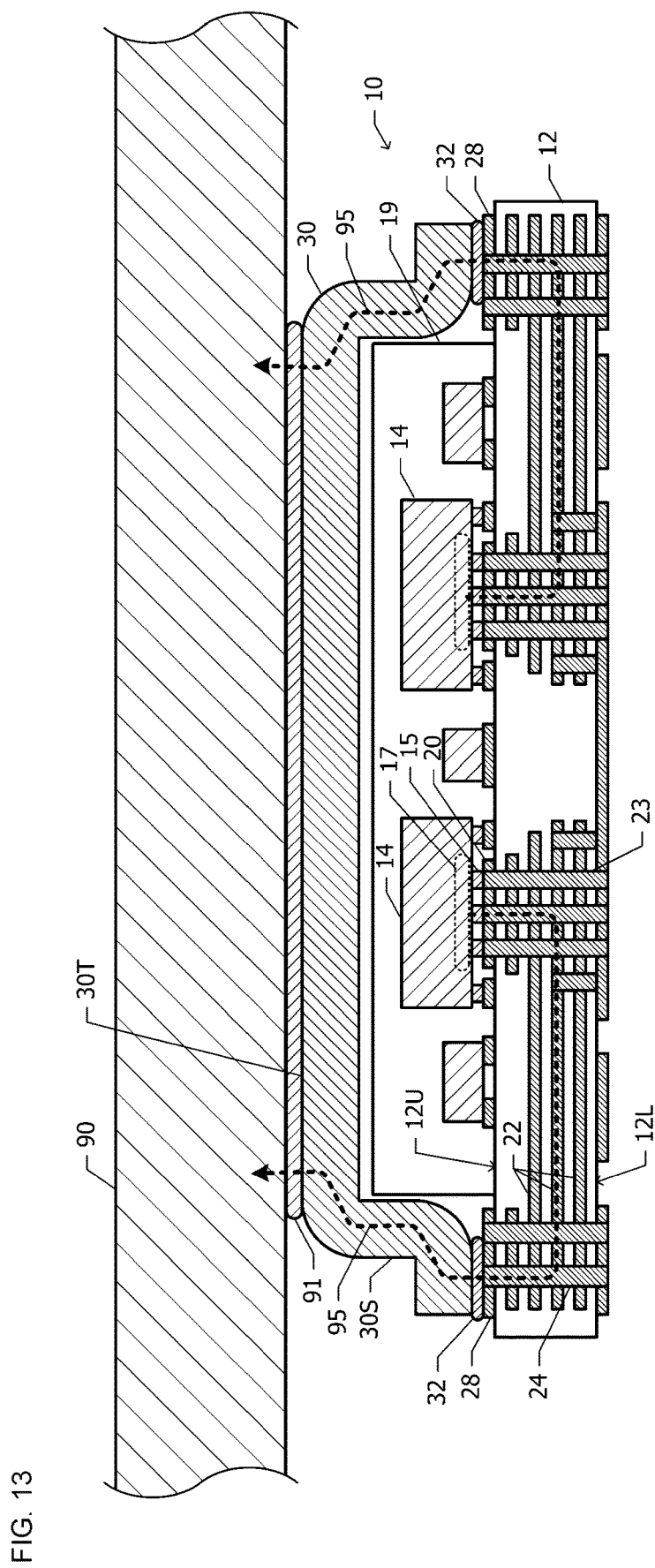
FIG. 13 is a cross-sectional view of a semiconductor package according to a sixth embodiment.

FIG. 13 is a cross-sectional view of the semiconductor package 10 and the casing 90 according to the sixth embodiment. In the first embodiment (FIG. 1), the side portion 30S of the metal member 30 is thermally coupled to the first metal films 22 at the side surfaces of the module substrate 12. In contrast, in the sixth embodiment, the side portion 30S of the metal member 30 is thermally coupled to not the side surfaces of the module substrate 12 but the first metal films 22 via a metal pad 28 disposed on the top surface 12U.

In the first embodiment (FIG. 1), the sealing resin 19 covers the entire region of the top surface 12U of the module substrate 12; whereas, in the sixth embodiment, a region not covered with the sealing resin 19 remains at the peripheral portion of the top surface 12U of the module substrate 12. The metal pad 28 is disposed on the top surface 12U of the module substrate 12 in a region not overlapping the semiconductor chips 14 or covered with the sealing resin 19. The metal pad 28 surrounds the sealing resin 19 in plan view.

The metal pad 28 is connected to the first metal films 22 in the internal layer via the via conductors 24. As in the case of the first embodiment (FIG. 1), the first metal films 22 are connected to the bumps 15 of the semiconductor chips 14 via the via conductors 23 and the metal pads 20. The module substrate 12-side end portion (lower end) of the side portion 30S of the metal member 30 is bent outward, and the surface facing the module substrate 12 is fixed to the metal pad 28 by the thermally conductive bonding material 32, such as solder and a thermally conductive paste. As in the case of the first embodiment (FIG. 3), the top portion 30T is thermally coupled to the casing 90 via the thermal coupling member 91. The heat conduction paths 95 from the heat generating sources 17 of the semiconductor chips 14 to the casing 90 through the bumps 15, the metal pads 20, the via conductors 23, the first metal films 22, the via conductors 24, the metal pad 28, the thermally conductive bonding material 32, the metal member 30, and the thermal coupling member 91 are formed.

Next, advantageous effects of the sixth embodiment will be described. In the sixth embodiment as well, as in the case of the first embodiment, heat generated by the heat generating sources 17 of the semiconductor chips 14 is conducted to the casing 90 through the heat conduction paths 95, so performance degradation due to the self-heating of the semiconductor chips 14 is reduced.

Next, a modification of the sixth embodiment will be described. In the semiconductor package 10 according to the sixth embodiment, as in the case of the second embodiment (FIG. 6) or the modification of the second embodiment (FIG. 7), the back surface metal film 40 may be provided on each of the semiconductor chips 14, and the back surface metal films 40 may be thermally coupled to the top portion 30T of the metal member 30. For example, the printed circuit board 41 (FIG. 6) may be disposed between the top portion 30T and the semiconductor chips 14 as in the case of the second embodiment, or the heat conduction plate 47 (FIG. 7) may be disposed between the top portion 30T and the semiconductor chips 14 as in the case of the modification of the second embodiment. Thus, as in the case of the second embodiment and the modification of the second embodiment, heat radiation performance from the semiconductor chips 14 is enhanced.

Seventh Embodiment

Next, a semiconductor device according to a seventh embodiment will be described with reference to FIG. 14. Hereinafter, the description of components common to the semiconductor package 10 (FIG. 1, FIG. 2, and FIG. 3) according to the first embodiment is omitted.

Figure 14:
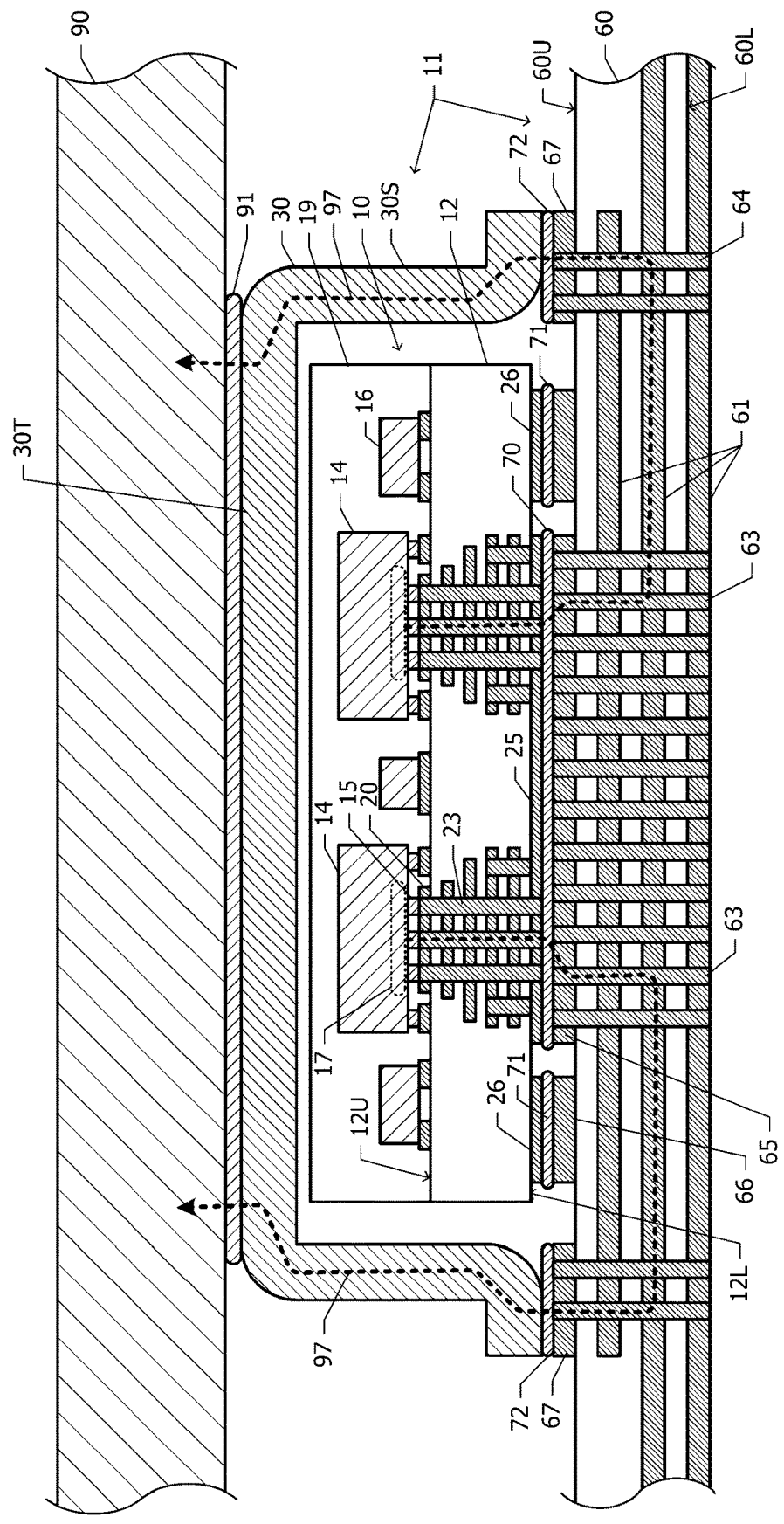
FIG. 14 is a cross-sectional view of a semiconductor device according to a seventh embodiment.

FIG. 14 is a cross-sectional view of the semiconductor device 11 according to the seventh embodiment. In the first embodiment (FIG. 1), the metal member 30 is fixed to the side surfaces of the module substrate 12. In contrast, in the seventh embodiment, the metal member 30 is fixed to not the module substrate 12 but the mother substrate 60 on which the semiconductor package 10 is mounted. The semiconductor device 11 includes the semiconductor package 10 and the mother substrate 60.

The semiconductor package 10 used in the semiconductor device 11 according to the seventh embodiment includes the module substrate 12, the plurality of semiconductor chips 14, the plurality of surface mount devices 16, and the sealing resin 19. The plurality of semiconductor chips 14 and the plurality of surface mount devices 16 are mounted on the top surface 12U of the module substrate 12. The plurality of bumps 15 of the semiconductor chips 14 are connected to the metal pads 20 disposed on the top surface 12U of the module substrate 12. The metal pads 20 are connected to the metal pad 25 on the bottom surface 12L via the plurality of via conductors 23. In plan view, the via conductors 23 are disposed at positions that overlap the semiconductor chips 14.

The metal pads 65, 66, 67 are disposed on the top surface 60U of the mother substrate 60. When the metal pads 25, 26 provided on the bottom surface 12L of the module substrate 12 are respectively connected to the metal pads 65, 66 of the mother substrate 60 by the solder 70 and the solder 71, the semiconductor package 10 is mounted on the mother substrate 60. The metal pad 67 is disposed at a position not overlapping the semiconductor package 10 in plan view and surrounds the semiconductor package 10.

The plurality of second metal films 61 is disposed in the internal layer and on the bottom surface 60L of the mother substrate 60. The second metal films 61 just need to be disposed in or on at least one of the internal layer and the bottom surface 60L. The plurality of second metal films 61 extends from regions overlapping the semiconductor chips 14 and reaches a region overlapping the metal pad 67 outside the semiconductor package 10 in plan view. The plurality of second metal films 61 is connected to one another and the metal pad 65 disposed on the top surface 60U by the plurality of via conductors 63 disposed at positions overlapping the semiconductor chips 14. The plurality of second metal films 61 is connected to the metal pad 67 via a plurality of via conductors 64. In other words, the metal pad 25 on the bottom surface of the semiconductor package 10 is electrically connected and thermally coupled to the metal pad 67 via the solder 70, the metal pad 65 of the mother substrate 60, the via conductors 63, the second metal films 61, and the via conductors 64.

The metal member 30 has the top portion 30T and the side portion 30S. The top portion 30T is disposed at a level higher than the semiconductor package 10 with reference to the top surface 60U of the mother substrate 60. The side portion 30S extends from the top portion 30T toward the mother substrate 60. In plan view, the top portion 30T includes the semiconductor package 10. The side portion 30S is connected and thermally coupled to the metal pad 67 by solder 72 at its lower end. The top portion 30T is thermally coupled to the casing 90 via the thermal coupling member 91.

Next, advantageous effects of the seventh embodiment will be described. In the seventh embodiment, heat conduction paths 97 from the heat generating sources 17 of the semiconductor chips 14 to the casing 90 through the bumps 15, the metal pads 20 on the top surface 12U of the module substrate 12, the via conductors 23, the metal pad 25 on the bottom surface 12L of the module substrate 12, the solder 70, the metal pad 65 on the top surface 60U of the mother substrate 60, the via conductors 63, the second metal films 61, the via conductors 64, the metal pad 67 on the top surface 60U of the mother substrate 60, the solder 72, the metal member 30, and the thermal coupling member 91 are formed.

In the existing apparatus, a sufficient heat conduction path from the mother substrate 60 to a member serving as a heat sink seems not to be ensured. In the seventh embodiment, the heat conduction paths 97 to the casing 90 via the mother substrate 60 are formed, so an excessive increase in the temperature of the semiconductor chips 14 is suppressed, with the result that performance degradation due to the self-heating of the semiconductor chips 14 is reduced.

Figure 15:
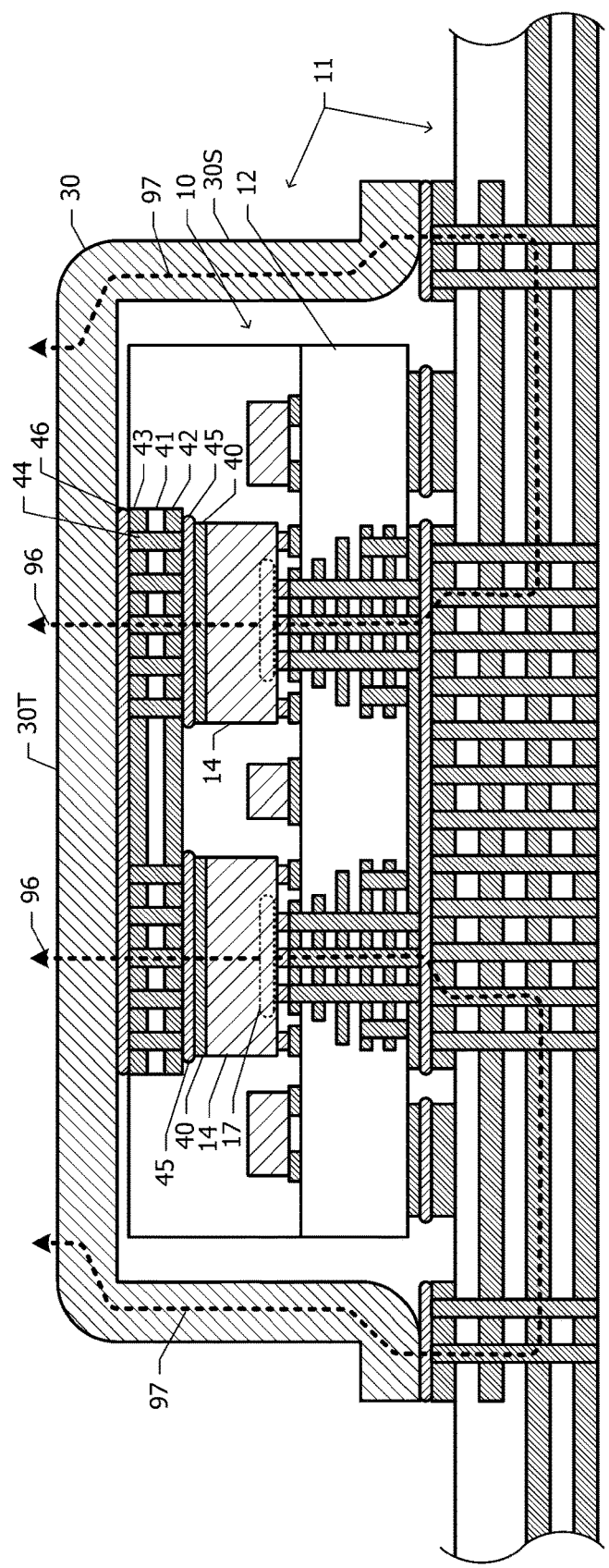
FIG. 15 is a cross-sectional view of a semiconductor device according to a modification of the seventh embodiment.

Next, a modification of the seventh embodiment will be described with reference to FIG. 15. FIG. 15 is a cross-sectional view of the semiconductor device 11 according to the modification of the seventh embodiment. In the present modification, as in the case of the second embodiment (FIG. 6), the back surface metal film 40 is disposed on the surface across from the device formation surface of each semiconductor chip 14. The printed circuit board 41 is disposed between the back surface metal films 40 and the top portion 30T of the metal member 30. The metal film 42 provided on the downward-facing surface of the printed circuit board 41 and each of the back surface metal films 40 are connected by the solder 45. The metal film 43 provided on the upward-facing surface of the printed circuit board 41 and the top portion 30T are connected by the solder 46. The metal film 42 on one of the surfaces and the metal film 43 on the other one of the surfaces are thermally coupled via the plurality of via conductors 44.

In the present modification, as in the case of the second embodiment (FIG. 6), in addition to the heat conduction paths 97, the heat conduction paths 96 from the heat generating sources 17 of the semiconductor chips 14 to the top portion 30T through the semiconductor substrates of the semiconductor chips 14, the back surface metal films 40, the solder 45, the metal films 42, 43 and the via conductors 44, provided in the printed circuit board 41, and the solder 46 are formed. Therefore, heat radiation performance from the heat generating sources 17 is further enhanced.

Figure 16:
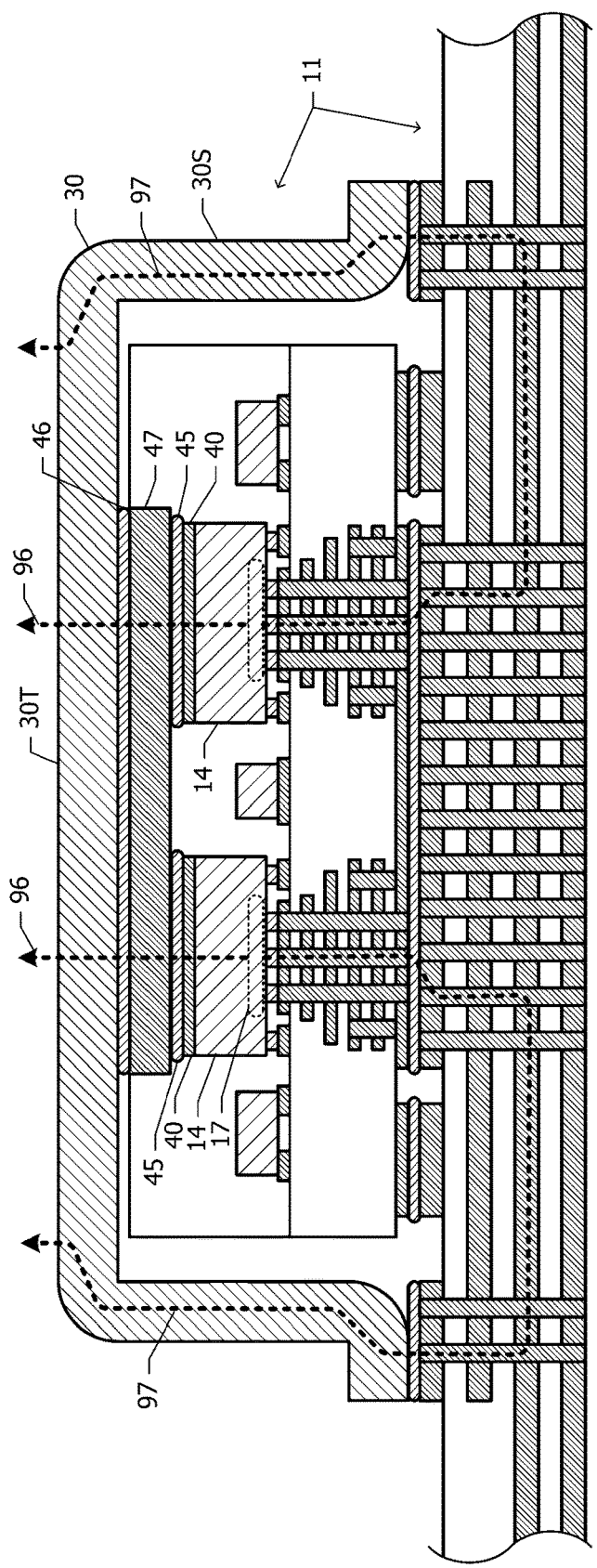
FIG. 16 is a cross-sectional view of a semiconductor device according to another modification of the seventh embodiment.

Next, another modification of the seventh embodiment will be described with reference to FIG. 16. FIG. 16 is a cross-sectional view of the semiconductor device 11 according to another modification of the seventh embodiment. In the present modification, the heat conduction plate 47 is disposed instead of the printed circuit board 41 used in the modification shown in FIG. 15. In the present modification, the heat conduction plate 47 is part of the heat conduction paths 96. In the present modification as well, as in the case of the modification shown in FIG. 15, heat radiation performance from the heat generating sources 17 is further enhanced.

Eighth Embodiment

Next, a semiconductor device according to an eighth embodiment will be described with reference to FIG. 17. Hereinafter, the description of components common to the semiconductor packages 10 and the mother substrate 60 described in the fourth embodiment (FIG. 10 and FIG. 11) is omitted.

Figure 17:
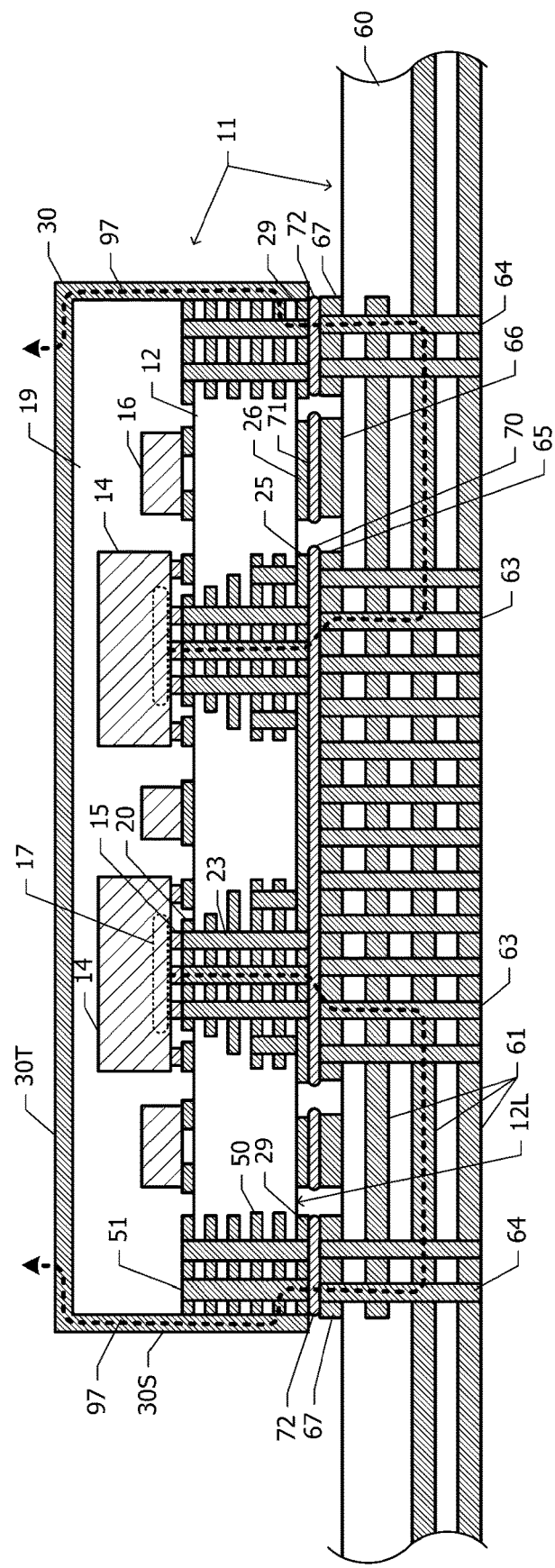
FIG. 17 is a cross-sectional view of a semiconductor device according to an eighth embodiment.

FIG. 17 is a cross-sectional view of the semiconductor device 11 according to the eighth embodiment. In the fourth embodiment (FIG. 10), the semiconductor chips 14 and the metal member 30 are thermally coupled via the first metal films 22 in the module substrate 12 or on the bottom surface 12L of the module substrate 12. In contrast, in the eighth embodiment, no metal film for thermally coupling the semiconductor chips 14 and the metal member 30 is disposed in the module substrate 12 or on the bottom surface 12L of the module substrate 12. The semiconductor chips 14 and the metal member 30 are thermally coupled by a metal member provided on or in the mother substrate 60.

In the eighth embodiment, a metal pad 29 is disposed at the peripheral portion on the bottom surface 12L in addition to the metal pads 25, 26 on the bottom surface 12L of the module substrate 12. In addition, a plurality of metal films 50 is disposed in the internal layer of the peripheral portion of the module substrate 12. The plurality of metal films 50 extends to the side surfaces of the module substrate 12. The plurality of metal films 50 is connected to the metal pad 29 on the bottom surface 12L via a plurality of via conductors 51.

As in the case of the fourth embodiment (FIG. 10), the plurality of semiconductor chips 14 and the plurality of surface mount devices 16, mounted on the module substrate 12, are sealed with the sealing resin 19. The surface of the sealing resin 19 and the side surfaces of the module substrate 12 are covered with the metal member 30. The plurality of metal films 50 is thermally coupled to the side portion 30S of the metal member 30 at the side surfaces of the module substrate 12.

The configuration of the mother substrate 60 is substantially the same as the configuration of the mother substrate 60 (FIG. 14) of the semiconductor device 11 according to the seventh embodiment. The metal pad 67 is disposed on the top surface 60U of the mother substrate 60 at a position facing the metal pad 29 at the peripheral portion of the module substrate 12. The metal pads 25, 26, 29 on the bottom surface 12L of the module substrate 12 are respectively connected to the metal pads 65, 66, 67 on the top surface 60U of the mother substrate 60 by the solder 70, the solder 71, and the solder 72.

Next, advantageous effects of the eighth embodiment will be described. In the eighth embodiment, the heat conduction paths 97 from the heat generating sources 17 of the semiconductor chips 14 to the top portion 30T through the bumps 15, the metal pads 20 on the top surface 12U of the module substrate 12, the via conductors 23, the metal pad 25 on the bottom surface 12L of the module substrate 12, the solder 70, the metal pad 65 on the top surface 60U of the mother substrate 60, the via conductors 63, the second metal films 61, the via conductors 64, the metal pad 67 on the top surface 60U of the mother substrate 60, the solder 72, the metal pad 29 on the bottom surface 12L of the module substrate 12, the via conductors 51, the metal films 50, and the side portion 30S of the metal member 30 are formed.

As in the case of the fourth embodiment (FIG. 11), the top portion 30T is thermally coupled to the casing 90 via the thermal coupling member 91. In a state of being accommodated in the casing 90, the heat conduction paths 97 from the semiconductor chips 14 to the casing 90 are formed. For this reason, as in the case of the seventh embodiment, an excessive increase in the temperature of the semiconductor chips 14 is suppressed, with the result that performance degradation due to the self-heating of the semiconductor chips 14 is reduced.

Figure 18:
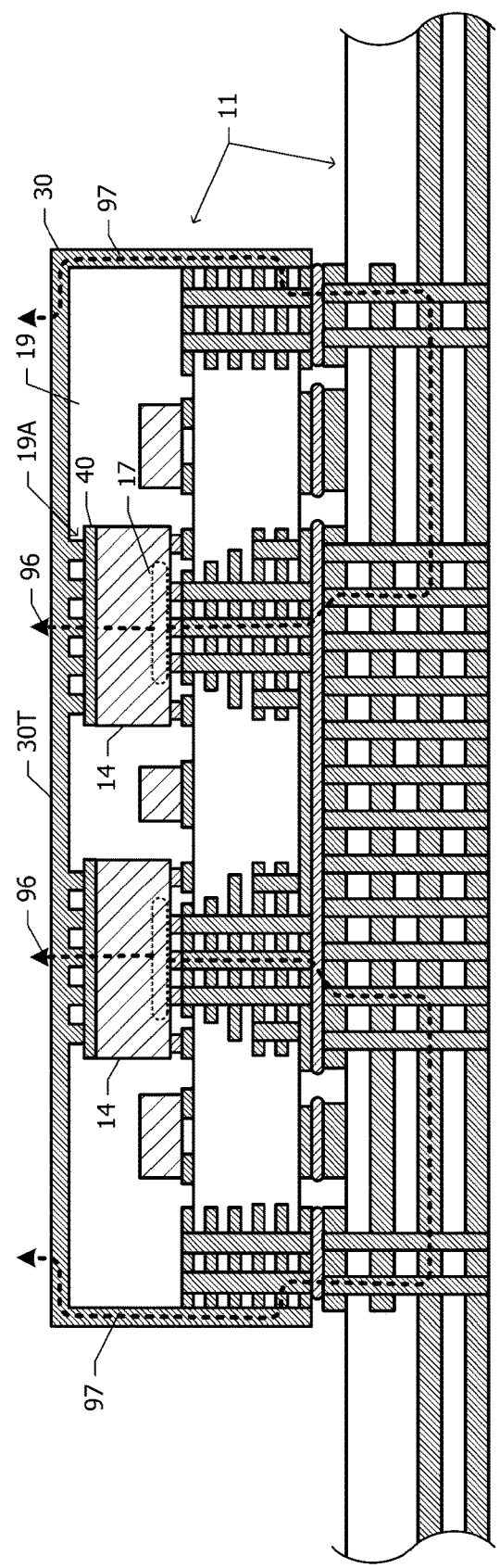
FIG. 18 is a cross-sectional view of a semiconductor device according to a modification of the eighth embodiment.

Next, a modification of the eighth embodiment will be described with reference to FIG. 18. FIG. 18 is a cross-sectional view of the semiconductor device 11 according to the modification of the eighth embodiment. In the present modification, as in the case of the fifth embodiment (FIG. 12), the back surface metal film 40 is disposed on the surface across from the device formation surface of each semiconductor chip 14, and the sealing resin 19 has the plurality of openings 19A. The top portion 30T of the metal member 30 is thermally coupled to the back surface metal films 40 through the openings 19A. In the present modification, as in the case of the fifth embodiment (FIG. 12), the heat conduction paths 96 passing through the openings 19A are formed, so heat radiation performance from the heat generating sources 17 of the semiconductor chips 14 is further enhanced.

Ninth Embodiment

Next, a semiconductor package-mounted apparatus according to a ninth embodiment will be described with reference to FIG. 19. Hereinafter, the description of components common to the semiconductor package 10 (FIG. 10) and the semiconductor package-mounted apparatus (FIG. 11) according to the fourth embodiment is omitted.

Figure 19:
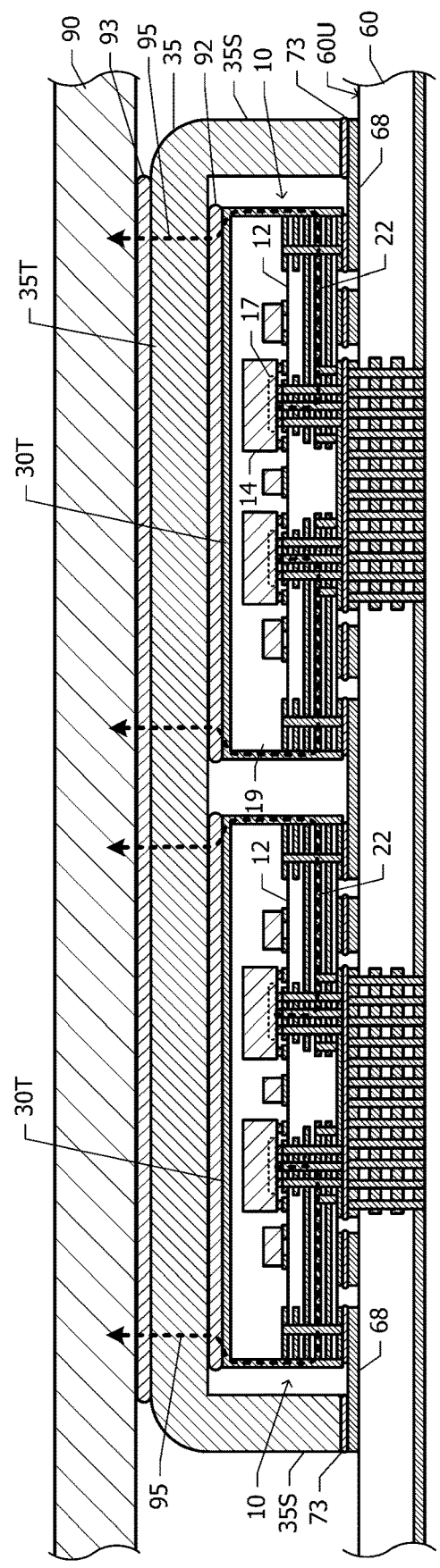
FIG. 19 is a cross-sectional view of a semiconductor package-mounted apparatus according to a ninth embodiment.

FIG. 19 is a cross-sectional view of the semiconductor package-mounted apparatus according to the ninth embodiment. In the ninth embodiment as well, as in the case of the fourth embodiment (FIG. 11), the two semiconductor packages 10 are mounted on the mother substrate 60. The configuration of each of the semiconductor packages 10 is the same as the configuration of the semiconductor package 10 (FIG. 10) according to the fourth embodiment. In the ninth embodiment, a metal cap 35 is attached to the mother substrate 60 so as to cover the two semiconductor packages 10.

The metal cap 35 has a top portion 35T and a side portion 35S. The top portion 35T includes the two semiconductor packages 10 in plan view. The side portion 35S extends from the top portion 35T toward the mother substrate 60. The lower end of the side portion 35S is fixed to a metal pad 68 on the top surface 60U of the mother substrate 60 by solder 73. The metal pad 68 is electrically connected to the first metal films 22 serving as ground planes in the module substrate 12. A plurality of surface mount devices is mounted on the top surface of the mother substrate 60 in addition to the semiconductor packages 10. The surface mount devices are mounted at portions other than the range of the cross section shown in FIG. 19 and are not shown in FIG. 19. The metal cap 35 also covers the plurality of surface mount devices.

Each of the top portions 30T of the metal members 30 respectively covering the sealing resins 19 of the two semiconductor packages 10 is thermally coupled to the top portion 35T of the metal cap 35 via a thermal coupling member 92, such as solder. The top portion 35T of the metal cap 35 is thermally coupled to the casing 90 via a thermal coupling member 93, such as solder. The heat conduction paths 95 from the heat generating sources 17 of the semiconductor chips 14 to each top portion 30T of the metal member 30 are the same as the heat conduction paths 95 of the semiconductor package 10 (FIG. 10) according to the fourth embodiment. In the ninth embodiment, the heat conduction paths 95 start from the top portions 30T, pass through the thermal coupling members 92, the top portion 35T of the metal cap 35, and the thermal coupling member 93, and reach the casing 90.

Next, advantageous effects of the ninth embodiment will be described. In the ninth embodiment as well, as in the case of the fourth embodiment (FIG. 10), heat can be conducted from the heat generating sources 17 of the semiconductor chips 14 to the casing 90 through the heat conduction paths 95 passing through the module substrates 12, the metal members 30, and the metal cap 35. Thus, an excessive increase in the temperature of the semiconductor chips 14 is suppressed, so performance degradation due to self-heating is reduced.

In addition, in the ninth embodiment, the metal cap 35 electrically connected to the first metal films 22 serving as ground planes functions as an electromagnetic shield. Therefore, radiation of noise from the surface mount devices mounted on the mother substrate 60, other than the semiconductor packages 10, and influences of noise on the surface mount devices are reduced.

Figure 20:
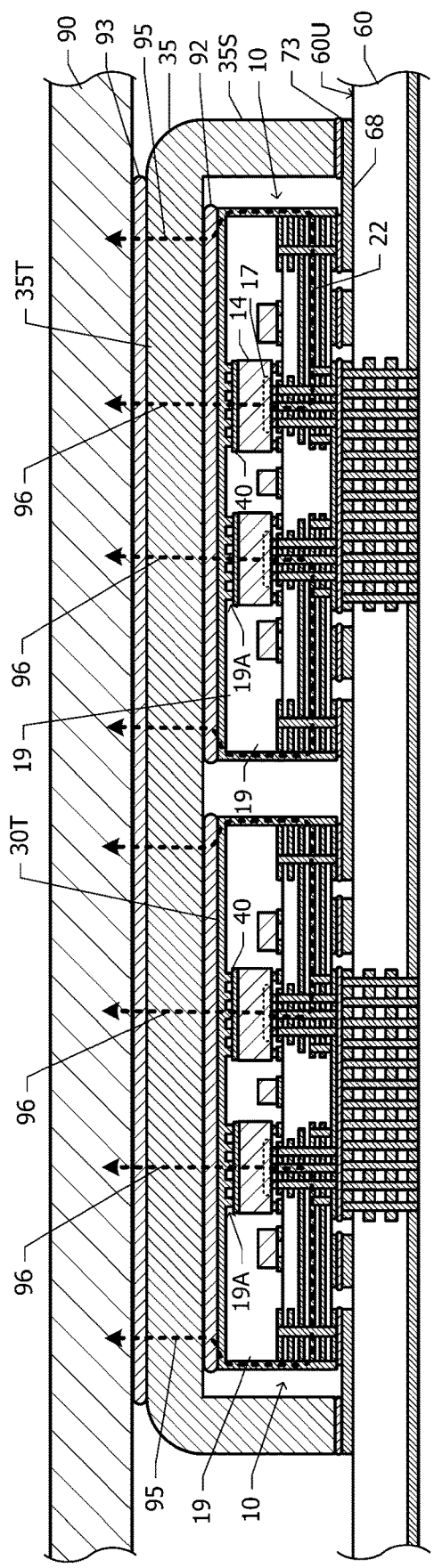
FIG. 20 is a cross-sectional view of a semiconductor package-mounted apparatus according to a modification of the ninth embodiment.

Next, a modification of the ninth embodiment will be described with reference to FIG. 20. FIG. 20 is a cross-sectional view of a semiconductor package-mounted apparatus according to the modification of the ninth embodiment. In the present modification, as in the case of the fifth embodiment (FIG. 12), the back surface metal film 40 is disposed on the surface across from the device formation surface of each semiconductor chip 14, and the sealing resin 19 of each semiconductor package 10 has the plurality of openings 19A. The top portion 30T of each metal member 30 is connected to the back surface metal films 40 through the openings 19A.

In the present modification, as in the case of the fifth embodiment (FIG. 12), in addition to the heat conduction paths 95, the heat conduction paths 96 from the heat generating sources 17 of the semiconductor chips 14 to the casing 90 through the openings 19A are formed. Therefore, heat radiation performance from the heat generating sources 17 is further enhanced as in the case of the fifth embodiment (FIG. 12).

Tenth Embodiment

Next, a semiconductor device-mounted apparatus according to a tenth embodiment will be described with reference to FIG. 21. Hereinafter, the description of components common to the semiconductor package-mounted apparatus (FIG. 19) according to the ninth embodiment is omitted.

Figure 21:
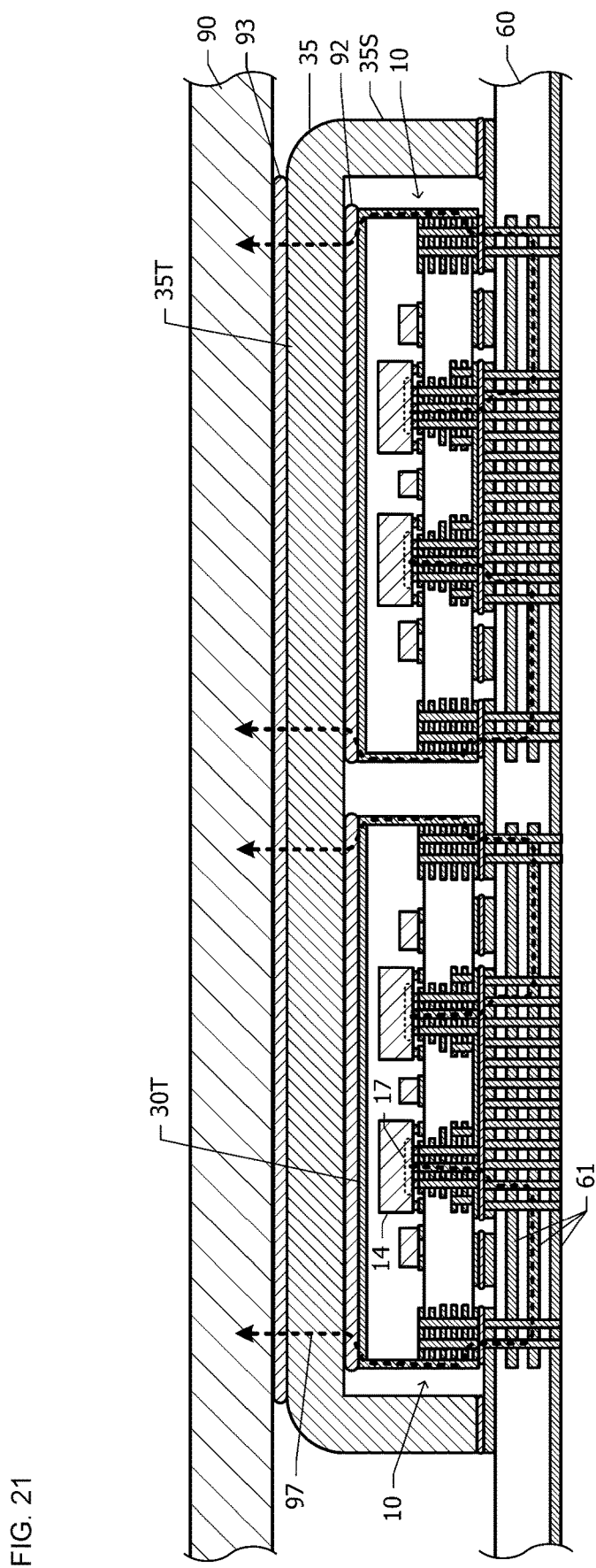
FIG. 21 is a cross-sectional view of a semiconductor device-mounted apparatus according to a tenth embodiment.

FIG. 21 is a cross-sectional view of the semiconductor device-mounted apparatus according to the tenth embodiment. In the ninth embodiment (FIG. 19), the first metal films 22 in each module substrate 12 make up part of the heat conduction paths 95 from the semiconductor chips 14 to the metal member 30. In contrast, in the tenth embodiment, as in the case of the eighth embodiment (FIG. 17), not the metal films in each module substrate 12 but the second metal films 61 in the mother substrate 60 make up part of the heat conduction paths 97 from the semiconductor chips 14 to the metal member 30. In addition, as in the case of the heat conduction paths 96 of the ninth embodiment (FIG. 19), the heat conduction paths 97 start from the metal member 30, pass through the thermal coupling member 92, the metal cap 35, and the thermal coupling member 93, and reach the casing 90.

Next, advantageous effects of the tenth embodiment will be described. In the tenth embodiment, heat generated by the heat generating sources 17 of the semiconductor chips 14 is conducted to the casing 90 through the heat conduction paths 97 partially including the second metal films 61 in the mother substrate 60. Therefore, heat radiation performance from the heat generating sources 17 is further enhanced as in the case of the eighth embodiment (FIG. 17).

Eleventh Embodiment

Next, a semiconductor device-mounted apparatus according to an eleventh embodiment will be described with reference to FIG. 22. Hereinafter, the description of components common to the semiconductor package 10 (FIG. 1, FIG. 2, and FIG. 3) according to the first embodiment is omitted.

Figure 22:
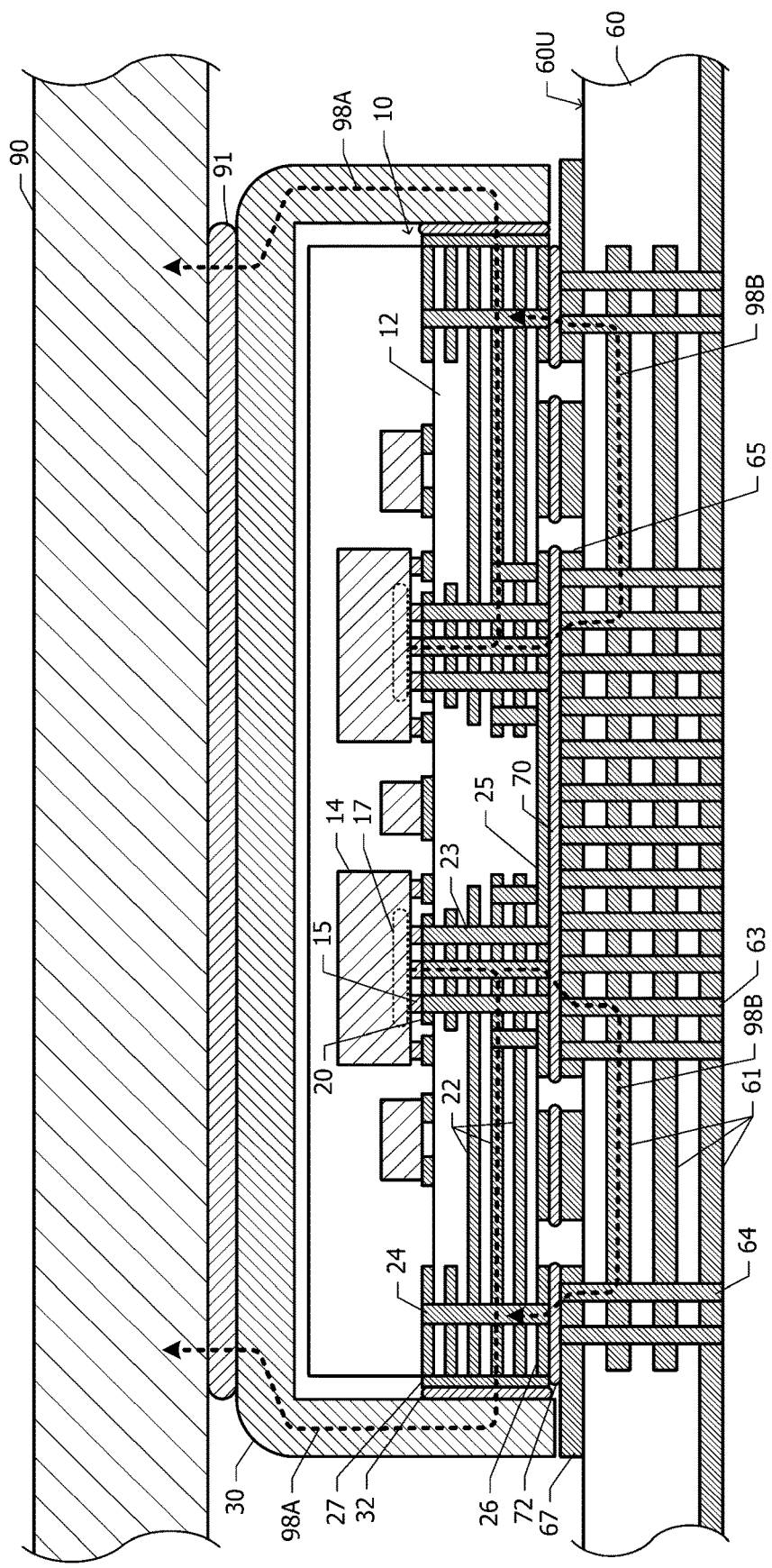
FIG. 22 is a cross-sectional view of a semiconductor device-mounted apparatus according to an eleventh embodiment.

FIG. 22 is a cross-sectional view of the semiconductor device-mounted apparatus according to the eleventh embodiment. In the first embodiment (FIG. 3), the heat conduction paths 95 from the via conductors 23 in the module substrate 12 to the side metal films 27 includes the first metal films 22 in the module substrate 12. No heat conduction paths from the via conductors 23 in the module substrate 12 to the side metal films 27 are formed in the mother substrate 60. In contrast, in the eleventh embodiment, first heat conduction paths 98A passing through the first metal films 22 in the module substrate 12 and second heat conduction paths 98B passing through the second metal films 61 in the mother substrate 60 are formed.

Specifically, the first heat conduction paths 98A start from the semiconductor chips 14, pass through the bumps 15, the metal pads 20 of the module substrate 12, the via conductors 23, the first metal films 22, the side metal films 27, the thermally conductive bonding materials 32, the metal member 30, and the thermal coupling member 91, and reach the casing 90.

The metal pad 67 is disposed on the top surface 60U of the mother substrate 60 so as to overlap the side surfaces of the semiconductor package 10 in plan view. The metal pad 65 is disposed on the top surface 60U of the mother substrate 60 so as to overlap the semiconductor chips 14. The second metal films 61 are disposed on or in at least one of the bottom surface 60L and the internal layer of the mother substrate 60 and extend from positions overlapping the semiconductor chips 14 in plan view to outside the semiconductor chips 14. The second metal films 61 reach a position overlapping the metal pad 67 in plan view.

The second metal films 61 are connected to the via conductors 23 in the module substrate 12 via the via conductors 63 in the mother substrate 60, the metal pad 65 on the top surface 60U, the solder 70, and the metal pad 25 of the module substrate 12. The second metal films 61 are connected to the first metal films 22 outside the semiconductor chips 14 in plan view via the via conductors 64 in the mother substrate 60, the metal pad 67 on the top surface 60U, the solder 72, the metal pad 26 at the peripheral portion of the module substrate 12, and the via conductors 24 in the module substrate 12. The second heat conduction path 98B branches off from the first heat conduction path 98A at the via conductors 23 and merges with the first heat conduction path 98A via the metal pad 25, the solder 70, the metal pad 65, the via conductors 63, the second metal films 61, the via conductors 64, the metal pad 67, the solder 72, the metal pad 26, and the via conductors 24.

Next, advantageous effects of the eleventh embodiment will be described. In the eleventh embodiment, the second heat conduction path 98B passing through the mother substrate 60 is connected in parallel with part of the first heat conduction path 98A passing through the module substrate 12. Therefore, the thermal resistance of the heat conduction paths from the semiconductor chips 14 to the casing 90 is reduced. As a result, heat radiation performance from the semiconductor chips 14 is further enhanced.

Twelfth Embodiment

Next, an amplifier circuit according to a twelfth embodiment will be described with reference to FIG. 23. The amplifier circuit according to the twelfth embodiment uses the semiconductor package 10 or the semiconductor device 11 according to any one of the first to eleventh embodiments.

Figure 23:
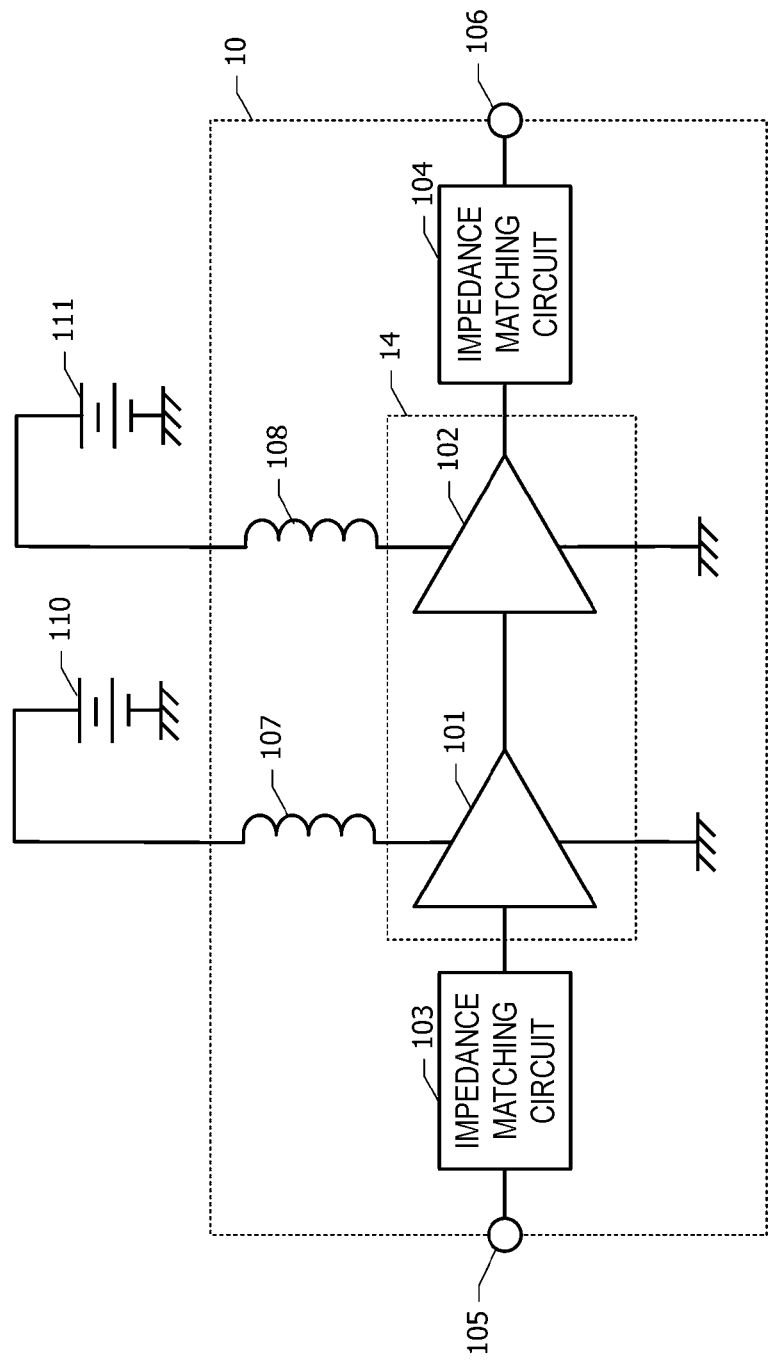
FIG. 23 is a block diagram of an amplifier circuit according to a twelfth embodiment.

FIG. 23 is a block diagram of the amplifier circuit according to the twelfth embodiment. A radio-frequency signal is input from an input terminal 105 to a driver stage amplifier 101 via an impedance matching circuit 103. The radio-frequency signal amplified by the driver stage amplifier 101 is input to a power stage amplifier 102. The radio-frequency signal amplified by the power stage amplifier 102 is output to an output terminal 106 via an impedance matching circuit 104.

A power source voltage is applied from a direct-current power source 110 to the driver stage amplifier 101 via an inductor 107. A power source voltage is applied from a direct-current power source 111 to the power stage amplifier 102 via an inductor 108.

For example, the driver stage amplifier 101 and the power stage amplifier 102 are implemented by the semiconductor chips 14 of the semiconductor package 10. Passive components of the impedance matching circuits 103, 104, and the inductors 107, 108 are implemented by the surface mount devices 16 (FIG. 1) mounted on the module substrate 12. Some or all of the passive components of each of the impedance matching circuits 103, 104 may be formed in the semiconductor chips 14. An interstage impedance matching circuit may be inserted between the driver stage amplifier 101 and the power stage amplifier 102.

Next, advantageous effects of the twelfth embodiment will be described. The semiconductor package 10 or the semiconductor device 11 of any one of the first to eleventh embodiments is used for the driver stage amplifier 101 and the power stage amplifier 102. Therefore, an excessive increase in the temperature of the driver stage amplifier 101 and the power stage amplifier 102 is suppressed, with the result that performance degradation due to the self-heating of the transistors in the driver stage amplifier 101 and the power stage amplifier 102 is reduced.

The above-described embodiments are illustrative, and, of course, partial replacements or combinations of components described in different embodiments are possible. Similar operation and advantageous effects with similar components of some of the embodiments will not be repeated one by one for each embodiment. The present disclosure is not limited to the above-described embodiments. It is obvious to persons skilled in the art that, for example, various modifications, improvements, combinations, and the like are possible.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A semiconductor package comprising:
    a module substrate having a top surface and a bottom surface facing in opposite directions;
    a semiconductor chip provided with a plurality of bumps and mounted on the top surface of the module substrate via the bumps; and
    a metal member having a top portion and a side portion, the top portion being disposed at a level higher than the semiconductor chip with reference to the top surface of the module substrate, the top portion including the semiconductor chip in plan view, the side portion extending from the top portion toward the module substrate, wherein
    the module substrate includes a first metal film disposed on or in at least one of the bottom surface and an internal layer of the module substrate,
    the first metal film is electrically connected to the bumps and reaches a side surface of the module substrate, and
    the side portion is thermally coupled to the first metal film at the side surface of the module substrate.

2. The semiconductor package according to claim 1, wherein
    the metal member is a metal cap having the top portion and the side portion, and
    the side portion is thermally coupled to the first metal film via a thermally conductive bonding material made of solder or a thermally conductive paste.

3. The semiconductor package according to claim 1, further comprising:
    a sealing resin sealing the semiconductor chip, wherein
    the metal member includes a coating film made of a metal and covering a surface of the sealing resin and the side surface of the module substrate, and
    the coating film is connected to the first metal film at the side surface of the module substrate.

4. The semiconductor package according to claim 1, further comprising:
    a back surface metal film on a surface of the semiconductor chip across from a surface facing the module substrate, wherein the top portion of the metal member is thermally coupled to the back surface metal film.

5. The semiconductor package according to claim 4, further comprising:
a printed circuit board disposed between the back surface metal film and the top portion, wherein
the printed circuit board includes a metal portion extending from one of surfaces of the printed circuit board to the other one of the surfaces, and
the top portion is thermally coupled to the back surface metal film via the metal portion of the printed circuit board.

6. The semiconductor package according to claim 4, further comprising:
a heat conduction plate disposed between the back surface metal film and the top portion, wherein
the top portion is thermally coupled to the back surface metal film via the heat conduction plate.

7. The semiconductor package according to claim 3, further comprising:
a back surface metal film on a surface of the semiconductor chip across from a surface facing the module substrate, wherein
the sealing resin has an opening extending from a top surface of the sealing resin to the back surface metal film, and
the coating film is thermally coupled to the back surface metal film through the opening of the sealing resin.

8. A semiconductor package comprising:
a module substrate having a top surface and a bottom surface facing in opposite directions;
a semiconductor chip provided with a plurality of bumps and mounted on the top surface of the module substrate via the bumps; and
a metal member having a top portion and a side portion, the top portion being disposed at a level higher than the semiconductor chip with reference to the top surface of the module substrate, the top portion including the semiconductor chip in plan view, the side portion extending from the top portion toward the module substrate, wherein
the module substrate includes
a metal pad disposed on the top surface in a region that does not overlap the semiconductor chip in plan view,
a first metal film disposed on or in at least one of the bottom surface and an internal layer of the module substrate, and
a via conductor disposed at a position that overlaps the semiconductor chip in plan view, the via conductor extending from the top surface of the module substrate to the bottom surface, the via conductor being electrically connected to the bumps,
the metal pad is electrically connected to the via conductor via the first metal film, and
the side portion is thermally coupled to the metal pad.

9. The semiconductor package according to claim 8, wherein
the metal member is a metal cap having the top portion and the side portion, and
the side portion is connected to the metal pad via a thermally conductive bonding material made of solder or a thermally conductive paste.

10. The semiconductor package according to claim 8, further comprising:
a back surface metal film on a surface of the semiconductor chip across from a surface facing the module substrate, wherein
the top portion is thermally coupled to the back surface metal film.

11. The semiconductor package according to claim 10, further comprising:
a printed circuit board disposed between the back surface metal film and the top portion, wherein
the printed circuit board includes a metal portion extending from one of surfaces of the printed circuit board to the other one of the surfaces, and
the top portion is thermally coupled to the back surface metal film via the metal portion of the printed circuit board.

12. The semiconductor package according to claim 10, further comprising:
a heat conduction plate disposed between the back surface metal film and the top portion, wherein
the top portion is thermally coupled to the back surface metal film via the heat conduction plate.

13. A semiconductor device comprising:
a semiconductor package including a module substrate having a top surface and a bottom surface facing in opposite directions and a semiconductor chip mounted on the top surface of the module substrate;
a mother substrate having a top surface and a bottom surface facing in opposite directions and on the top surface of which the semiconductor package is mounted; and
a metal member having a top portion and a side portion, the top portion being disposed at a level higher than the semiconductor package with reference to the top surface of the mother substrate, the top portion including the semiconductor package in plan view, the side portion extending from the top portion toward the mother substrate, wherein
the mother substrate includes a metal pad disposed on the top surface in a region that does not overlap the semiconductor package and a second metal film disposed on or in at least one of the bottom surface and an internal layer of the mother substrate, the semiconductor package and the metal pad are electrically connected via the second metal film, and
the side portion is thermally coupled to the metal pad.

14. The semiconductor device according to claim 13, wherein
the semiconductor package further includes a sealing resin sealing the semiconductor chip, and
the metal member includes a coating film made of a metal and covering a top surface and a side surface of the sealing resin and a side surface of the module substrate.

15. The semiconductor device according to claim 14, wherein
the semiconductor package further includes a back surface metal film on a surface of the semiconductor chip across from a surface facing the module substrate,
the sealing resin has an opening extending from a top surface of the sealing resin to the back surface metal film, and
the coating film is thermally coupled to the back surface metal film through the opening of the sealing resin.

16. The semiconductor device according to claim 14, further comprising:
a metal cap covering the semiconductor package and fixed to the mother substrate; and a thermal coupling member disposed between the coating film and the metal cap and thermally coupling the coating film to the metal cap.

17. A semiconductor device comprising:
a semiconductor package; and
a mother substrate on a top surface of which the semiconductor package is mounted, the top surface being one of surfaces of the mother substrate, wherein
the semiconductor package includes
- a module substrate having a top surface and a bottom surface facing in opposite directions,
- a semiconductor chip provided with a plurality of bumps and mounted on the top surface of the module substrate via the bumps, and
- a metal member having a top portion and a side portion, the top portion being disposed at a level higher than the semiconductor chip with reference to the top surface of the module substrate, the top portion including the semiconductor package in plan view, the side portion extending from the top portion toward the mother substrate, the module substrate includes a first heat conduction path disposed on or in at least one of the bottom surface and an internal layer and extending from the bumps to the side portion, and
the mother substrate includes a second heat conduction path thermally coupled to the bumps at a portion that overlaps the semiconductor chip in plan view and thermally coupled to the side portion outside the semiconductor chip.

18. The semiconductor device according to claim 17, wherein
the first heat conduction path includes
a first metal film disposed on or in at least one of the bottom surface and the internal layer of the module substrate and extending from inside the semiconductor chip to outside the semiconductor chip in plan view, and
a first via conductor disposed in the module substrate and connecting the bumps to the first metal film,
the second heat conduction path includes
a second metal film disposed on or in at least one of a bottom surface and an internal layer of the mother substrate and extending from inside the semiconductor chip to outside the semiconductor chip in plan view, and
a second via conductor disposed in the mother substrate, the second via conductor being disposed at a position that overlaps the semiconductor chip in plan view, the second via conductor electrically connecting the second metal film and the first via conductor, and
the second metal film is thermally coupled to the side portion outside the semiconductor chip in plan view.

19. A semiconductor package-mounted apparatus comprising:
the semiconductor package according to claim 1;
a casing accommodating the semiconductor package; and
a thermal coupling member thermally coupling the top portion to the casing.

20. A semiconductor device-mounted apparatus comprising:
the semiconductor device according to claim 13;
a casing accommodating the semiconductor device; and
a thermal coupling member thermally coupling the top portion to the casing.

* * * * *